(12) United States Patent
Fullerton et al.

(10) Patent No.: US 8,957,751 B2
(45) Date of Patent: Feb. 17, 2015

(54) SYSTEM AND METHOD FOR AFFECTING FLUX OF MULTI-POLE MAGNETIC STRUCTURES

(71) Applicant: Correlated Magnetics Research, LLC, Huntsville, AL (US)

(72) Inventors: Larry W. Fullerton, New Hope, AL (US); Mark D. Roberts, Huntsville, AL (US)

(73) Assignee: Correlated Magnetics Research LLC, Huntsville, AL (US)

( * ) Notice: Subject to any disclaimer, the term of this patent is extended or adjusted under 35 U.S.C. 154(b) by 0 days.

(21) Appl. No.: 14/066,426

(22) Filed: Oct. 29, 2013

(65) Prior Publication Data

US 2014/0191830 A1    Jul. 10, 2014

Related U.S. Application Data

(63) Continuation of application No. 13/374,074, filed on Dec. 9, 2011, now Pat. No. 8,576,036.

(60) Provisional application No. 61/459,329, filed on Dec. 10, 2010, provisional application No. 61/459,994, filed on Dec. 22, 2010.

(51) Int. Cl.
*H01H 1/00*      (2006.01)
*H05K 9/00*     (2006.01)
(Continued)

(52) U.S. Cl.
CPC .............. *H05K 9/00* (2013.01); *H01F 7/0205* (2013.01); *H01F 3/12* (2013.01)
USPC .......................................... 335/296; 335/306

(58) Field of Classification Search
USPC ........................................................ 335/296
See application file for complete search history.

(56) References Cited

U.S. PATENT DOCUMENTS 93,931 A     8/1869   Westcott
361,248 A    4/1887   Winton
(Continued)

FOREIGN PATENT DOCUMENTS

CN   1615573 A    5/2005
DE   2938782 A1   4/1981
(Continued)

OTHER PUBLICATIONS

Atallah et al., 2004, "Design, analysis and realisation of a high-performance magnetic gear", IEE Proc.-Electr. Power Appl., vol. 151, No. 2, Mar. 2004.
(Continued)

*Primary Examiner* — Shawki S Ismail
*Assistant Examiner* — Lisa Homza
(74) *Attorney, Agent, or Firm* — Vector IP Law Group; Robert S. Babayi

(57) ABSTRACT

A shunt plate is provided that is associated with a first side of a multi-pole magnetic structure. The shunt plate provides a magnetic short between opposite polarity magnetic sources on the first side of said magnetic structure, the magnetic short causing a magnetic flux of said opposite polarity magnetic sources to be routed from said first side of the magnetic structure through said magnetic structure to the second side of said magnetic structure. The thickness of the shunt plate is selected by determining the integrated flux across a magnetic source of the magnetic structure such that the corresponding flux density in the shunt plate does not substantially exceed the flux density saturation level of a cross section of the shunt plate.

19 Claims, 12 Drawing Sheets

(51) Int. Cl.
*H01F 7/02* (2006.01)
*H01F 3/12* (2006.01)

(56) References Cited

U.S. PATENT DOCUMENTS

| | | |
|---|---|---|
| 493,858 A | 3/1893 | Edison |
| 675,323 A | 5/1901 | Clark |
| 687,292 A | 11/1901 | Armstrong |
| 996,933 A | 7/1911 | Lindquist |
| 1,081,462 A | 12/1913 | Patton |
| 1,171,351 A | 2/1916 | Neuland |
| 1,236,234 A | 8/1917 | Troje |
| 1,252,289 A | 1/1918 | Murray, Jr. |
| 1,301,135 A | 4/1919 | Karasick |
| 1,312,546 A | 8/1919 | Karasick |
| 1,323,546 A | 8/1919 | Karasick |
| 1,554,236 A | 1/1920 | Simmons |
| 1,343,751 A | 6/1920 | Simmons |
| 1,624,741 A | 12/1926 | Leppke et al. |
| 1,784,256 A | 12/1930 | Stout |
| 1,895,129 A | 1/1933 | Jones |
| 2,048,161 A | 7/1936 | Klaiber |
| 2,147,482 A | 12/1936 | Butler |
| 2,186,074 A | 1/1940 | Koller |
| 2,240,035 A | 4/1941 | Catherall |
| 2,243,555 A | 5/1941 | Faus |
| 2,269,149 A | 1/1942 | Edgar |
| 2,327,748 A | 8/1943 | Smith |
| 2,337,248 A | 12/1943 | Koller |
| 2,337,249 A | 12/1943 | Koller |
| 2,389,298 A | 11/1945 | Ellis |
| 2,401,887 A | 6/1946 | Sheppard |
| 2,414,653 A | 1/1947 | Iokholder |
| 2,438,231 A | 3/1948 | Schultz |
| 2,471,634 A | 5/1949 | Vennice |
| 2,475,456 A | 7/1949 | Norlander |
| 2,508,305 A | 5/1950 | Teetor |
| 2,513,226 A | 6/1950 | Wylie |
| 2,514,927 A | 7/1950 | Bernhard |
| 2,520,828 A | 8/1950 | Bertschi |
| 2,565,624 A | 8/1951 | Phelon |
| 2,570,625 A | 10/1951 | Zimmerman et al. |
| 2,690,349 A | 9/1954 | Teetor |
| 2,694,164 A | 11/1954 | Geppelt |
| 2,964,613 A | 11/1954 | Williams |
| 2,701,158 A | 2/1955 | Schmitt |
| 2,722,617 A | 11/1955 | Cluwen et al. |
| 2,770,759 A | 11/1956 | Ahlgren |
| 2,837,366 A | 6/1958 | Loeb |
| 2,853,331 A | 9/1958 | Teetor |
| 2,888,291 A | 5/1959 | Scott et al. |
| 2,896,991 A | 7/1959 | Martin, Jr. |
| 2,932,545 A | 4/1960 | Foley |
| 2,935,352 A | 5/1960 | Heppner |
| 2,935,353 A | 5/1960 | Loeb |
| 2,936,437 A | 5/1960 | Fraser et al. |
| 2,962,318 A | 11/1960 | Teetor |
| 3,055,999 A | 9/1962 | Lucas |
| 3,089,986 A | 5/1963 | Gauthier |
| 3,102,314 A | 9/1963 | Alderfer |
| 3,151,902 A | 10/1964 | Ahlgren |
| 3,204,995 A | 9/1965 | Teetor |
| 3,208,296 A | 9/1965 | Baermann |
| 3,238,399 A | 3/1966 | Johanees et al. |
| 3,273,104 A | 9/1966 | Krol |
| 3,288,511 A | 11/1966 | Tavano |
| 3,301,091 A | 1/1967 | Reese |
| 3,351,368 A | 11/1967 | Sweet |
| 3,382,386 A | 5/1968 | Schlaeppi |
| 3,408,104 A | 10/1968 | Raynes |
| 3,414,309 A | 12/1968 | Tresemer |
| 3,425,729 A | 2/1969 | Bisbing |
| 3,468,576 A | 9/1969 | Beyer et al. |
| 3,474,366 A | 10/1969 | Barney |
| 3,500,090 A | 3/1970 | Baermann |
| 3,521,216 A | 7/1970 | Tolegian |
| 3,645,650 A | 2/1972 | Laing |
| 3,668,670 A | 6/1972 | Andersen |
| 3,684,992 A | 8/1972 | Huguet et al. |
| 3,690,393 A | 9/1972 | Guy |
| 3,696,258 A | 10/1972 | Anderson et al. |
| 3,790,197 A | 2/1974 | Parker |
| 3,791,309 A | 2/1974 | Baermann |
| 3,802,034 A | 4/1974 | Bookless |
| 3,803,433 A | 4/1974 | Ingenito |
| 3,808,577 A | 4/1974 | Mathauser |
| 3,836,801 A | 9/1974 | Yamashita et al. |
| 3,845,430 A | 10/1974 | Petkewicz et al. |
| 3,893,059 A | 7/1975 | Nowak |
| 3,976,316 A | 8/1976 | Laby |
| 4,079,558 A | 3/1978 | Gorham |
| 4,117,431 A | 9/1978 | Eicher |
| 4,129,846 A | 12/1978 | Yablochnikov |
| 4,209,905 A | 7/1980 | Gillings |
| 4,222,489 A | 9/1980 | Hutter |
| 4,296,394 A | 10/1981 | Ragheb |
| 4,340,833 A | 7/1982 | Sudo et al. |
| 4,352,960 A | 10/1982 | Dormer et al. |
| 4,355,236 A | 10/1982 | Holsinger |
| 4,399,595 A | 8/1983 | Yoon et al. |
| 4,416,127 A | 11/1983 | Gomez-Olea Naveda |
| 4,451,811 A | 5/1984 | Hoffman |
| 4,453,294 A | 6/1984 | Morita |
| 4,517,483 A | 5/1985 | Hucker et al. |
| 4,535,278 A | 8/1985 | Asakawa |
| 4,547,756 A | 10/1985 | Miller et al. |
| 4,629,131 A | 12/1986 | Podell |
| 4,645,283 A | 2/1987 | MacDonald et al. |
| 4,680,494 A | 7/1987 | Grosjean |
| 381,968 A | 5/1988 | Tesla |
| 4,764,743 A | 8/1988 | Leupold et al. |
| 4,808,955 A | 2/1989 | Godkin et al. |
| 4,837,539 A | 6/1989 | Baker |
| 4,849,749 A | 7/1989 | Fukamachi et al. |
| 4,862,128 A | 8/1989 | Leupold |
| H000693 H | 10/1989 | Leupold |
| 4,893,103 A | 1/1990 | Leupold |
| 4,912,727 A | 3/1990 | Schubert |
| 4,941,236 A | 7/1990 | Sherman et al. |
| 4,956,625 A | 9/1990 | Cardone et al. |
| 4,980,593 A | 12/1990 | Edmundson |
| 4,993,950 A | 2/1991 | Mensor, Jr. |
| 4,994,778 A | 2/1991 | Leupold |
| 4,996,457 A | 2/1991 | Hawsey et al. |
| 5,013,949 A | 5/1991 | Mabe, Jr. |
| 5,020,625 A | 6/1991 | Yamauchi et al. |
| 5,050,276 A | 9/1991 | Pemberton |
| 5,062,855 A | 11/1991 | Rincoe |
| 5,123,843 A | 6/1992 | Van der Zel et al. |
| 5,179,307 A | 1/1993 | Porter |
| 5,190,325 A | 3/1993 | Doss-Desouza |
| 5,213,307 A | 5/1993 | Perrillat-Amede |
| 5,302,929 A | 4/1994 | Kovacs |
| 5,309,680 A | 5/1994 | Kiel |
| 5,345,207 A | 9/1994 | Gebele |
| 5,349,258 A | 9/1994 | Leupold et al. |
| 5,367,891 A | 11/1994 | Furuyama |
| 5,383,049 A | 1/1995 | Carr |
| 5,394,132 A | 2/1995 | Poil |
| 5,399,933 A | 3/1995 | Tsai |
| 5,425,763 A | 6/1995 | Stemmann |
| 5,440,997 A | 8/1995 | Crowley |
| 5,461,386 A | 10/1995 | Knebelkamp |
| 5,485,435 A | 1/1996 | Matsuda et al. |
| 5,492,572 A | 2/1996 | Schroeder et al. |
| 5,495,221 A | 2/1996 | Post |
| 5,512,732 A | 4/1996 | Yagnik et al. |
| 5,570,084 A | 10/1996 | Ritter et al. |
| 5,582,522 A | 12/1996 | Johnson |
| 5,604,960 A | 2/1997 | Good |
| 5,631,093 A | 5/1997 | Perry et al. |
| 5,631,618 A | 5/1997 | Trumper et al. |
| 5,633,555 A | 5/1997 | Ackermann et al. |
| 5,635,889 A | 6/1997 | Stelter |

(56) References Cited

U.S. PATENT DOCUMENTS

| | | |
|---|---|---|
| 5,637,972 A | 6/1997 | Randall et al. |
| 5,730,155 A | 3/1998 | Allen |
| 5,742,036 A | 4/1998 | Schramm, Jr. et al. |
| 5,759,054 A | 6/1998 | Spadafore |
| 5,788,493 A | 8/1998 | Tanaka et al. |
| 5,838,304 A | 11/1998 | Hall |
| 5,852,393 A | 12/1998 | Reznik et al. |
| 5,935,155 A | 8/1999 | Humayun et al. |
| 5,956,778 A | 9/1999 | Godoy |
| 5,983,406 A | 11/1999 | Meyerrose |
| 6,000,484 A | 12/1999 | Zoretich et al. |
| 6,039,759 A | 3/2000 | Carpentier et al. |
| 6,047,456 A | 4/2000 | Yao et al. |
| 6,072,251 A | 6/2000 | Markle |
| 6,074,420 A | 6/2000 | Eaton |
| 6,104,108 A | 8/2000 | Hazelton et al. |
| 6,115,849 A | 9/2000 | Meyerrose |
| 6,118,271 A | 9/2000 | Ely et al. |
| 6,120,283 A | 9/2000 | Cousins |
| 6,125,955 A | 10/2000 | Zoretich et al. |
| 6,142,779 A | 11/2000 | Siegel et al. |
| 6,170,131 B1 | 1/2001 | Shin |
| 6,187,041 B1 | 2/2001 | Garonzik |
| 6,188,147 B1 | 2/2001 | Hazelton et al. |
| 6,205,012 B1 | 3/2001 | Lear |
| 6,210,033 B1 | 4/2001 | Karkos, Jr. et al. |
| 6,224,374 B1 | 5/2001 | Mayo |
| 6,234,833 B1 | 5/2001 | Tsai et al. |
| 6,241,069 B1 | 6/2001 | Mazur et al. |
| 6,273,918 B1 | 8/2001 | Yuhasz et al. |
| 6,275,778 B1 | 8/2001 | Shimada et al. |
| 6,285,097 B1 | 9/2001 | Hazelton et al. |
| 6,387,096 B1 | 5/2002 | Hyde, Jr. |
| 6,422,533 B1 | 7/2002 | Harms |
| 6,457,179 B1 | 10/2002 | Prendergast |
| 6,467,326 B1 | 10/2002 | Garrigus |
| 6,535,092 B1 | 3/2003 | Hurley et al. |
| 6,540,515 B1 | 4/2003 | Tanaka |
| 6,561,815 B1 | 5/2003 | Schmidt |
| 6,599,321 B2 | 7/2003 | Hyde, Jr. |
| 6,607,304 B1 | 8/2003 | Lake et al. |
| 6,652,278 B2 | 11/2003 | Honkura et al. |
| 6,653,919 B2 | 11/2003 | Shih-Chung et al. |
| 6,720,698 B2 | 4/2004 | Galbraith |
| 6,747,537 B1 | 6/2004 | Mosteller |
| 6,821,126 B2 | 11/2004 | Neidlein |
| 6,841,910 B2 | 1/2005 | Gery |
| 6,842,332 B1 | 1/2005 | Rubenson et al. |
| 6,847,134 B2 | 1/2005 | Frissen et al. |
| 6,850,139 B1 | 2/2005 | Dettmann et al. |
| 6,862,748 B2 | 3/2005 | Prendergast |
| 6,864,773 B2 | 3/2005 | Perrin |
| 6,913,471 B2 | 7/2005 | Smith |
| 6,927,657 B1 | 8/2005 | Wu |
| 6,936,937 B2 | 8/2005 | Tu et al. |
| 6,954,968 B1 | 10/2005 | Sitbon |
| 6,971,147 B2 | 12/2005 | Halstead |
| 7,009,874 B2 | 3/2006 | Deak |
| 7,016,492 B2 | 3/2006 | Pan et al. |
| 7,031,160 B2 | 4/2006 | Tillotson |
| 7,033,400 B2 | 4/2006 | Currier |
| 7,038,565 B1 | 5/2006 | Chell |
| 7,065,860 B2 | 6/2006 | Aoki et al. |
| 7,066,739 B2 | 6/2006 | McLeish |
| 7,066,778 B2 | 6/2006 | Kretzschmar |
| 7,097,461 B2 | 8/2006 | Neidlein |
| 7,101,374 B2 | 9/2006 | Hyde, Jr. |
| 7,135,792 B2 | 11/2006 | Devaney et al. |
| 7,137,727 B2 | 11/2006 | Joseph et al. |
| 7,186,265 B2 | 3/2007 | Sharkawy et al. |
| 7,224,252 B2 | 5/2007 | Meadow, Jr. et al. |
| 7,264,479 B1 | 9/2007 | Lee |
| 7,276,025 B2 | 10/2007 | Roberts et al. |
| 7,311,526 B2 | 12/2007 | Rohrbach et al. |
| 7,339,790 B2 | 3/2008 | Baker et al. |
| 7,344,380 B2 | 3/2008 | Neidlein et al. |
| 7,351,066 B2 | 4/2008 | DiFonzo et al. |
| 7,358,724 B2 | 4/2008 | Taylor et al. |
| 7,362,018 B1 | 4/2008 | Kulogo et al. |
| 7,364,433 B2 | 4/2008 | Neidlein |
| 7,381,181 B2 | 6/2008 | Lau et al. |
| 7,402,175 B2 | 7/2008 | Azar |
| 7,416,414 B2 | 8/2008 | Bozzone et al. |
| 7,438,726 B2 | 10/2008 | Erb |
| 7,444,683 B2 | 11/2008 | Prendergast et al. |
| 7,453,341 B1 | 11/2008 | Hildenbrand |
| 7,467,948 B2 | 12/2008 | Lindberg et al. |
| 7,498,914 B2 | 3/2009 | Miyashita et al. |
| 7,583,500 B2 | 9/2009 | Ligtenberg et al. |
| 7,637,746 B2 | 12/2009 | Lindberg et al. |
| 7,645,143 B2 | 1/2010 | Rohrbach et al. |
| 7,658,613 B1 | 2/2010 | Griffin et al. |
| 7,715,890 B2 | 5/2010 | Kim et al. |
| 7,762,817 B2 | 7/2010 | Ligtenberg et al. |
| 7,775,567 B2 | 8/2010 | Ligtenberg et al. |
| 7,796,002 B2 | 9/2010 | Hashimoto et al. |
| 7,799,281 B2 | 9/2010 | Cook et al. |
| 7,808,349 B2 | 10/2010 | Fullerton et al. |
| 7,812,697 B2 | 10/2010 | Fullerton et al. |
| 7,817,004 B2 | 10/2010 | Fullerton et al. |
| 7,828,556 B2 | 11/2010 | Rodrigues |
| 7,832,897 B2 | 11/2010 | Ku |
| 7,837,032 B2 | 11/2010 | Smeltzer |
| 7,839,246 B2 | 11/2010 | Fullerton et al. |
| 7,843,297 B2 | 11/2010 | Fullerton et al. |
| 7,868,721 B2 | 1/2011 | Fullerton et al. |
| 7,871,272 B2 | 1/2011 | Firman, II et al. |
| 7,874,856 B1 | 1/2011 | Schriefer et al. |
| 7,889,037 B2 | 2/2011 | Cho |
| 7,901,216 B2 | 3/2011 | Rohrbach et al. |
| 7,903,397 B2 | 3/2011 | McCoy |
| 7,905,626 B2 | 3/2011 | Shantha et al. |
| 7,997,906 B2 | 8/2011 | Ligtenberg et al. |
| 8,002,585 B2 | 8/2011 | Zhou |
| 8,009,001 B1 | 8/2011 | Cleveland |
| 8,050,714 B2 | 11/2011 | Fadell et al. |
| 8,078,224 B2 | 12/2011 | Fadell et al. |
| 8,078,776 B2 | 12/2011 | Novotney et al. |
| 8,087,939 B2 | 1/2012 | Rohrbach et al. |
| 8,099,964 B2 | 1/2012 | Saito et al. |
| 8,138,869 B1 | 3/2012 | Lauder et al. |
| 8,143,982 B1 | 3/2012 | Lauder et al. |
| 8,143,983 B1 | 3/2012 | Lauder et al. |
| 8,165,634 B2 | 4/2012 | Fadell et al. |
| 8,177,560 B2 | 5/2012 | Rohrbach et al. |
| 8,187,006 B2 | 5/2012 | Rudisill et al. |
| 8,190,205 B2 | 5/2012 | Fadell et al. |
| 8,242,868 B2 | 8/2012 | Lauder et al. |
| 8,253,518 B2 | 8/2012 | Lauder et al. |
| 8,264,310 B2 | 9/2012 | Lauder et al. |
| 8,264,314 B2 | 9/2012 | Sankar |
| 8,271,038 B2 | 9/2012 | Fadell et al. |
| 8,271,705 B2 | 9/2012 | Novotney et al. |
| 8,297,367 B2 | 10/2012 | Chen et al. |
| 8,344,836 B2 | 1/2013 | Lauder et al. |
| 8,348,678 B2 | 1/2013 | Hardisty et al. |
| 8,354,767 B2 | 1/2013 | Pennander et al. |
| 8,390,411 B2 | 3/2013 | Lauder et al. |
| 8,390,412 B2 | 3/2013 | Lauder et al. |
| 8,390,413 B2 | 3/2013 | Lauder et al. |
| 8,395,465 B2 | 3/2013 | Lauder et al. |
| 8,398,409 B2 | 3/2013 | Schmidt |
| 8,435,042 B2 | 5/2013 | Rohrbach et al. |
| 8,454,372 B2 | 6/2013 | Lee et al. |
| 8,467,829 B2 | 6/2013 | Fadell et al. |
| 8,497,753 B2 | 7/2013 | DiFonzo et al. |
| 8,514,042 B2 | 8/2013 | Lauder et al. |
| 8,535,088 B2 | 9/2013 | Gao et al. |
| 8,576,031 B2 | 11/2013 | Lauder et al. |
| 8,576,034 B2 | 11/2013 | Bilbrey et al. |
| 8,616,362 B1 | 12/2013 | Browne et al. |
| 8,648,679 B2 | 2/2014 | Lauder et al. |
| 8,665,044 B2 | 3/2014 | Lauder et al. |
| 8,665,045 B2 | 3/2014 | Lauder et al. |

(56) References Cited

U.S. PATENT DOCUMENTS

| | | | |
|---|---|---|---|
| 8,690,582 B2 | 4/2014 | Rohrbach et al. |
| 8,702,316 B2 | 4/2014 | DiFonzo et al. |
| 8,734,024 B2 | 5/2014 | Isenhour et al. |
| 8,752,200 B2 | 6/2014 | Varshavsky et al. |
| 8,757,893 B1 | 6/2014 | Isenhour et al. |
| 8,770,857 B2 | 7/2014 | DiFonzo et al. |
| 8,774,577 B2 | 7/2014 | Benjamin et al. |
| 8,781,273 B2 | 7/2014 | Benjamin et al. |
| 2002/0125977 A1 | 9/2002 | VanZoest |
| 2003/0136837 A1 | 7/2003 | Amon et al. |
| 2003/0170976 A1 | 9/2003 | Molla et al. |
| 2003/0179880 A1 | 9/2003 | Pan et al. |
| 2003/0187510 A1 | 10/2003 | Hyde |
| 2004/0003487 A1 | 1/2004 | Reiter |
| 2004/0155748 A1 | 8/2004 | Steingroever |
| 2004/0244636 A1 | 12/2004 | Meadow et al. |
| 2004/0251759 A1 | 12/2004 | Hirzel |
| 2005/0102802 A1 | 5/2005 | Sitbon et al. |
| 2005/0196484 A1 | 9/2005 | Khoshnevis |
| 2005/0231046 A1 | 10/2005 | Aoshima |
| 2005/0240263 A1 | 10/2005 | Fogarty et al. |
| 2005/0263549 A1 | 12/2005 | Scheiner |
| 2005/0283839 A1 | 12/2005 | Cowburn |
| 2006/0066428 A1 | 3/2006 | McCarthy et al. |
| 2006/0189259 A1 | 8/2006 | Park et al. |
| 2006/0198047 A1 | 9/2006 | Xue et al. |
| 2006/0198998 A1 | 9/2006 | Raksha et al. |
| 2006/0214756 A1 | 9/2006 | Elliott et al. |
| 2006/0290451 A1 | 12/2006 | Prendergast et al. |
| 2006/0293762 A1 | 12/2006 | Schulman et al. |
| 2007/0072476 A1 | 3/2007 | Milan |
| 2007/0075594 A1 | 4/2007 | Sadler |
| 2007/0103266 A1 | 5/2007 | Wang et al. |
| 2007/0138806 A1 | 6/2007 | Ligtenberg et al. |
| 2007/0255400 A1 | 11/2007 | Parravicini et al. |
| 2007/0267929 A1 | 11/2007 | Pulnikov et al. |
| 2008/0119250 A1 | 5/2008 | Cho et al. |
| 2008/0139261 A1 | 6/2008 | Cho et al. |
| 2008/0174392 A1 | 7/2008 | Cho |
| 2008/0181804 A1 | 7/2008 | Tanigawa et al. |
| 2008/0186683 A1 | 8/2008 | Ligtenberg et al. |
| 2008/0218299 A1 | 9/2008 | Arnold |
| 2008/0224806 A1 | 9/2008 | Ogden et al. |
| 2008/0272868 A1 | 11/2008 | Prendergast et al. |
| 2008/0282517 A1 | 11/2008 | Claro |
| 2009/0021333 A1 | 1/2009 | Fiedler |
| 2009/0209173 A1 | 8/2009 | Arledge et al. |
| 2009/0250576 A1 | 10/2009 | Fullerton et al. |
| 2009/0251256 A1 | 10/2009 | Fullerton et al. |
| 2009/0254196 A1 | 10/2009 | Cox et al. |
| 2009/0278642 A1 | 11/2009 | Fullerton et al. |
| 2009/0289090 A1 | 11/2009 | Fullerton et al. |
| 2009/0289749 A1 | 11/2009 | Fullerton et al. |
| 2009/0292371 A1 | 11/2009 | Fullerton et al. |
| 2010/0033280 A1 | 2/2010 | Bird et al. |
| 2010/0126857 A1 | 5/2010 | Polwart et al. |
| 2010/0167576 A1 | 7/2010 | Zhou |
| 2011/0026203 A1 | 2/2011 | Ligtenberg et al. |
| 2011/0085157 A1 | 4/2011 | Bloss et al. |
| 2011/0101088 A1 | 5/2011 | Marguerettaz et al. |
| 2011/0210636 A1 | 9/2011 | Kuhlmann-Wilsdorf |
| 2011/0234344 A1 | 9/2011 | Fullerton et al. |
| 2011/0248806 A1 | 10/2011 | Michael |
| 2011/0279205 A1 | 11/2011 | Fullerton et al. |
| 2012/0007704 A1 | 1/2012 | Nerl |
| 2012/0064309 A1 | 3/2012 | Kwon et al. |
| 2012/0085753 A1 | 4/2012 | Fitch et al. |
| 2012/0146752 A1* | 6/2012 | Fullerton et al. ............. 335/306 |
| 2012/0235519 A1 | 9/2012 | Dyer et al. |
| 2013/0001745 A1 | 1/2013 | Iwaki |
| 2013/0186209 A1 | 7/2013 | Herbst |
| 2013/0186473 A1 | 7/2013 | Mankame et al. |
| 2013/0186807 A1 | 7/2013 | Browne et al. |
| 2013/0187538 A1 | 7/2013 | Herbst |
| 2013/0192860 A1 | 8/2013 | Puzio et al. |
| 2013/0207758 A1 | 8/2013 | Browne et al. |
| 2013/0252375 A1 | 9/2013 | Yi et al. |
| 2013/0256274 A1 | 10/2013 | Faulkner |
| 2013/0270056 A1 | 10/2013 | Mankame et al. |
| 2013/0305705 A1 | 11/2013 | Ac et al. |
| 2013/0341137 A1 | 12/2013 | Mandame et al. |
| 2014/0044972 A1 | 2/2014 | Menassa et al. |
| 2014/0072261 A1 | 4/2014 | Isenhour et al. |
| 2014/0152252 A1 | 6/2014 | Wood et al. |
| 2014/0205235 A1 | 7/2014 | Benjamin et al. |
| 2014/0221741 A1 | 8/2014 | Wang et al. |

FOREIGN PATENT DOCUMENTS

| | | |
|---|---|---|
| EP | 0 345 554 A1 | 12/1989 |
| EP | 0 545 737 A1 | 6/1993 |
| FR | 823395 A | 1/1938 |
| GB | 1 495 677 A | 12/1977 |
| JP | S57-55908 U | 4/1982 |
| JP | S57-189423 U | 12/1982 |
| JP | 60-091011 U | 6/1985 |
| JP | 60-221238 A | 11/1985 |
| JP | 2001-328483 A | 11/2001 |
| JP | 2008-035676 A | 2/2008 |
| JP | 05-038123 B2 | 10/2012 |
| WO | WO-02/31945 A2 | 4/2002 |
| WO | WO-2007/081830 A2 | 7/2007 |
| WO | WO-2009/124030 A1 | 10/2009 |
| WO | WO-2010/141324 A1 | 12/2010 |

OTHER PUBLICATIONS

Atallah et al., 2001, "A Novel High-Performance Magnetic Gear", IEEE Transactions on Magnetics, vol. 37, No. 4, Jul. 2001, p. 2844-2846.

Bassani, R., 2007, "Dynamic Stability of Passive Magnetic Bearings", Nonlinear Dynamics, V. 50, p. 161-168.

BNS 33 Range, Magnetic safety sensors, Rectangular design, http://www.farnell.com/datasheets/36449.pdf, 3 pages, date unknown.

Boston Gear 221S-4, One-stage Helical Gearbox, http://www.bostongear.com/pdf/product_sections/200_series_helical.pdf, referenced Jun. 2010.

Charpentier et al., 2001, "Mechanical Behavior of Axially Magnetized Permanent-Magnet Gears", IEEE Transactions on Magnetics, vol. 37, No. 3, May 2001, p. 1110-1117.

Chau et al., 2008, "Transient Analysis of Coaxial Magnetic Gears Using Finite Element Comodeling", Journal of Applied Physics, vol. 103.

Choi et al., 2010, "Optimization of Magnetization Directions in a 3-D Magnetic Structure", IEEE Transactions on Magnetics, vol. 46, No. 6, Jun. 2010, p. 1603-1606.

Correlated Magnetics Research, 2009, Online Video, "Innovative Magnetics Research in Huntsville", http://www.youtube.com/watch?v=m4m81JjZCJo.

Correlated Magnetics Research, 2009, Online Video, "Non-Contact Attachment Utilizing Permanent Magnets", http://www.youtube.com/watch?v=3xUm25CNNgQ.

Correlated Magnetics Research, 2010, Company Website, http://www.correlatedmagnetics.com.

Furlani 1996, "Analysis and optimization of synchronous magnetic couplings", J. Appl. Phys., vol. 79, No. 8, p. 4692.

Furlani 2001, "Permanent Magnet and Electromechanical Devices", Academic Press, San Diego.

Furlani, E.P., 2000, "Analytical analysis of magnetically coupled multipole cylinders", J. Phys. D: Appl. Phys., vol. 33, No. 1, p. 28-33.

General Electric DP 2.7 Wind Turbine Gearbox, http://www.gedrivetrain.com/insideDP27.cfm, referenced Jun. 2010.

Ha et al., 2002, "Design and Characteristic Analysis of Non-Contact Magnet Gear for Conveyor by Using Permanent Magnet", Conf. Record of the 2002 IEEE Industry Applications Conference, p. 1922-1927.

Huang et al., 2008, "Development of a Magnetic Planetary Gearbox", IEEE Transactions on Magnetics, vol. 44, No. 3, p. 403-412.

(56) References Cited

OTHER PUBLICATIONS

International Search Report and Written Opinion dated Jun. 1, 2009, directed to counterpart application No. PCT/US2009/002027. (10 pages).
International Search Report and Written Opinion of the International Searching Authority issued in Application No. PCT/US12/61938 dated Feb. 26, 2013.
International Search Report and Written Opinion of the International Searching Authority issued in Application No. PCT/US2013/028095 dated May 13, 2013.
International Search Report and Written Opinion of the International Searching Authority issued in Application No. PCT/US2013/047986 dated Nov. 21, 2013.
International Search Report and Written Opinion, dated Apr. 8, 2011 issued in related International Application No. PCT/US2010/049410.
International Search Report and Written Opinion, dated Aug. 18, 2010, issued in related International Application No. PCT/US2010/036443.
International Search Report and Written Opinion, dated Jul. 13, 2010, issued in related International Application No. PCT/US2010/021612.
International Search Report and Written Opinion, dated May 14, 2009, issued in related International Application No. PCT/US2009/038925.
Jian et al., "Comparison of Coaxial Magnetic Gears With Different Topologies", IEEE Transactions on Magnetics, vol. 45, No. 10, Oct. 2009, p. 4526-29.
Jian, L., Chau, K.T., 2010, "A Coaxial Magnetic Gear With Halbach Permanent-Magnet Arrays", IEEE Transactions on Energy Conversion, vol. 25, No. 2, Jun. 2010, p. 319-28.
Jørgensen et al., "The Cycloid Permanent Magnetic Gear", IEEE Transactions on Industry Applications, vol. 44, No. 6, Nov./Dec. 2008, p. 1659-65.
Jørgensen et al., 2005, "Two dimensional model of a permanent magnet spur gear", Conf. Record of the 2005 IEEE Industry Applications Conference, p. 261-5.
Kim, "A future cost trends of magnetizer systems in Korea", Industrial Electronics, Control, and Instrumentation, 1996, vol. 2, Aug. 5, 1996, pp. 991-996.
Krasil'nikov et al., 2008, "Calculation of the Shear Force of Highly Coercive Permanent Magnets in Magnetic Systems With Consideration of Affiliation to a Certain Group Based on Residual Induction", Chemical and Petroleum Engineering, vol. 44, Nos. 7-8, p. 362-65.
Krasil'nikov et al., 2009, "Torque Determination for a Cylindrical Magnetic Clutch", Russian Engineering Research, vol. 29, No. 6, pp. 544-547.
Liu et al., 2009, "Design and Analysis of Interior-magnet Outer-rotor Concentric Magnetic Gears", Journal of Applied Physics, vol. 105.
Lorimer, W., Hartman, A., 1997, "Magnetization Pattern for Increased Coupling in Magnetic Clutches", IEEE Transactions on Magnetics, vol. 33, No. 5, Sep. 1997.
Mezani, S., Atallah, K., Howe, D. , 2006, "A high-performance axial-field magnetic gear", Journal of Applied Physics vol. 99.
Mi, "Magnetreater/Charger Model 580" Magnetic Instruments Inc. Product specification, May 4, 2009, http://web.archive.org/web/20090504064511/http://www.maginst.com/specifications/580_magnetreater.htm, 2 pages.
Neugart PLE-160, One-Stage Planetary Gearbox, http://www.neugartusa.com/ple_160_gb.pdf, referenced Jun. 2010.
Series BNS, Compatible Series AES Safety Controllers, http://www.schmersalusa.com/safety_controllers/drawings/aes.pdf, pp. 159-175, date unknown.
Series BNS-B20, Coded-Magnet Sensorr Safety Door Handle, http://www.schmersalusa.com/catalog_pdfs/BNS_B20.pdf, 2pages, date unknown.
Series BNS333, Coded-Magnet Sensors with Integral Safety Control Module, http://www.schmersalusa.com/machine_guarding/coded_magnet/drawings/bns333.pdf, 2 pages, date unknown.
Tsurumoto 1992, "Basic Analysis on Transmitted Force of Magnetic Gear Using Permanent Magnet", IEEE Translation Journal on Magnetics in Japan, Vo 7, No. 6, Jun. 1992, p. 447-52.
United States Office Action issued in U.S. Appl. No. 13/104,393 dated Apr. 4, 2013.
United States Office Action issued in U.S. Appl. No. 13/236,413 dated Jun. 6, 2013.
United States Office Action issued in U.S. Appl. No. 13/246,584 dated May 16, 2013.
United States Office Action issued in U.S. Appl. No. 13/246,584 dated Oct. 15, 2013.
United States Office Action issued in U.S. Appl. No. 13/374,074 dated Feb. 21, 2013.
United States Office Action issued in U.S. Appl. No. 13/430,219 dated Aug. 13, 2013.
United States Office Action issued in U.S. Appl. No. 13/470,994 dated Aug. 8, 2013.
United States Office Action issued in U.S. Appl. No. 13/470,994 dated Jan. 7, 2013.
United States Office Action issued in U.S. Appl. No. 13/470,994 dated Nov. 8, 2013.
United States Office Action issued in U.S. Appl. No. 13/529,520 dated Sep. 28, 2012.
United States Office Action issued in U.S. Appl. No. 13/530,893 dated Mar. 22, 2013.
United States Office Action issued in U.S. Appl. No. 13/530,893 dated Oct. 29, 2013.
United States Office Action issued in U.S. Appl. No. 13/718,839 dated Dec. 16, 2013.
United States Office Action issued in U.S. Appl. No. 13/855,519 dated Jul. 17, 2013.
United States Office Action issued in U.S. Appl. No. 13/928,126 dated Oct. 11, 2013.
United States Office Action, dated Aug. 26, 2011, issued in counterpart U.S. Appl. No. 12/206,270.
United States Office Action, dated Feb. 2, 2011, issued in counterpart U.S. Appl. No. 12/476,952.
United States Office Action, dated Mar. 12, 2012, issued in counterpart U.S. Appl. No. 12/206,270.
United States Office Action, dated Mar. 9, 2012, issued in counterpart U.S. Appl. No. 13/371,280.
United States Office Action, dated Oct. 12, 2011, issued in counterpart U.S. Appl. No. 12/476,952.
Wikipedia, "Barker Code", Web article, last modified Aug. 2, 2008, 2 pages.
Wikipedia, "Bitter Electromagnet", Web article, last modified Aug. 2011, 1 page.
Wikipedia, "Costas Array", Web article, last modified Oct. 7, 2008, 4 pages.
Wikipedia, "Gold Code", Web article, last modified Jul. 27, 2008, 1 page.
Wikipedia, "Golomb Ruler", Web article, last modified Nov. 4, 2008, 3 pages.
Wikipedia, "Kasami Code", Web article, last modified Jun. 11, 2008, 1 page.
Wikipedia, "Linear feedback shift register", Web article, last modified Nov. 11, 2008, 6 pages.
Wikipedia, "Walsh Code", Web article, last modified Sep. 17, 2008, 2 pages.
C. Pompermaier, L. Sjoberg, and G. Nord, Design and Optimization of a Permanent Magnet Transverse Flux Machine, XXth International Conference on Electrical Machines, Sep. 2012, p. 606, IEEE Catalog No. CFP1290B-PRT, ISBN: 978-1-4673-0143-5.
V. Rudnev, An Objective Assessment of Magnetic Flux Concentrators, HET Trating Progress, Nov./Dec. 2004, p. 19-23.

* cited by examiner

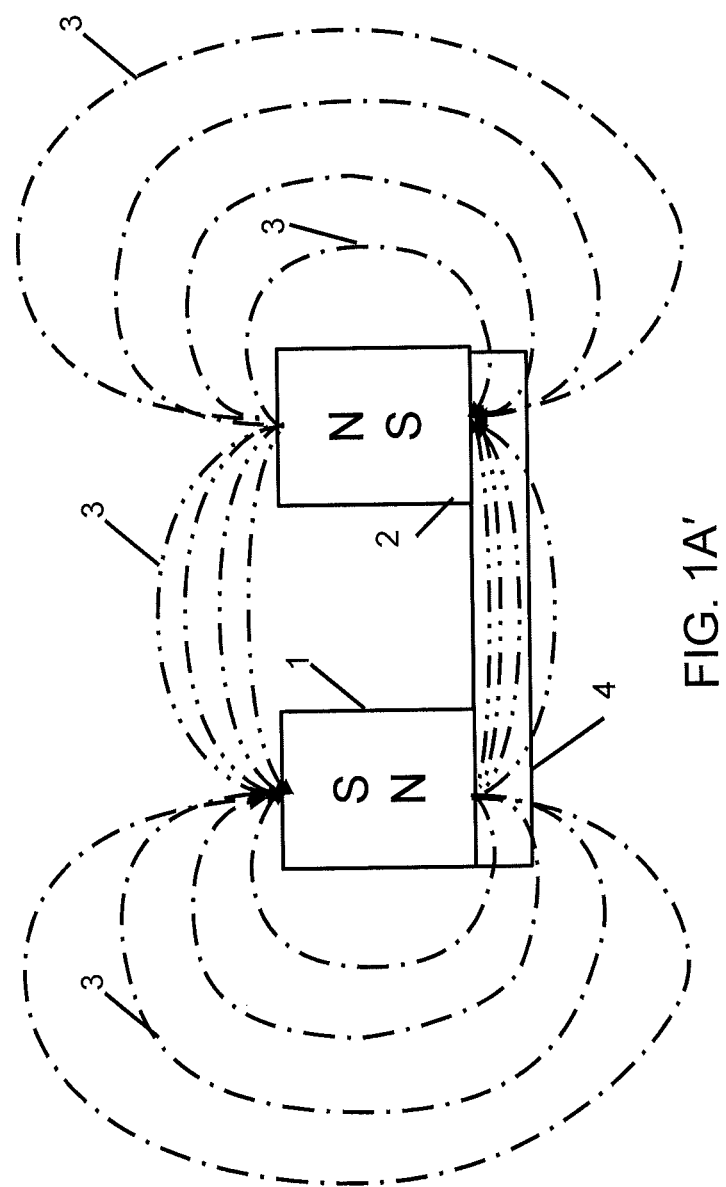

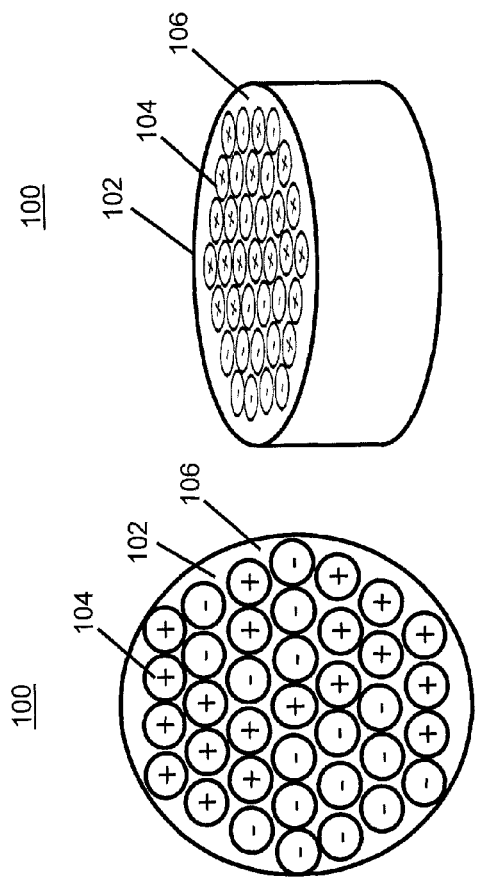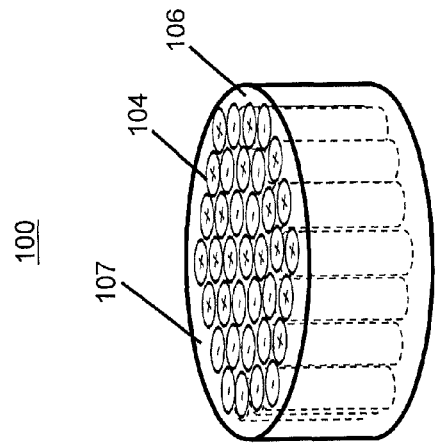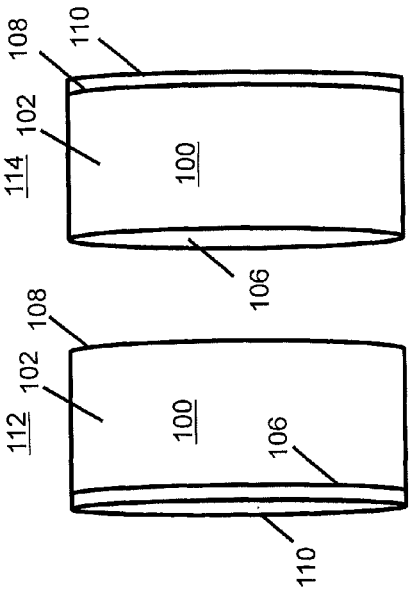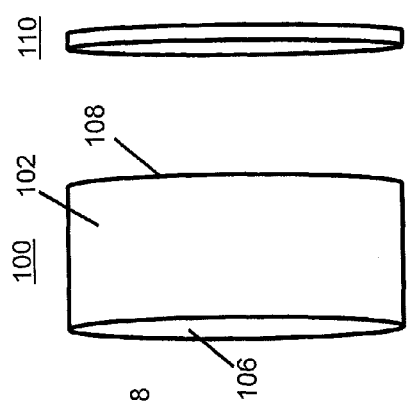

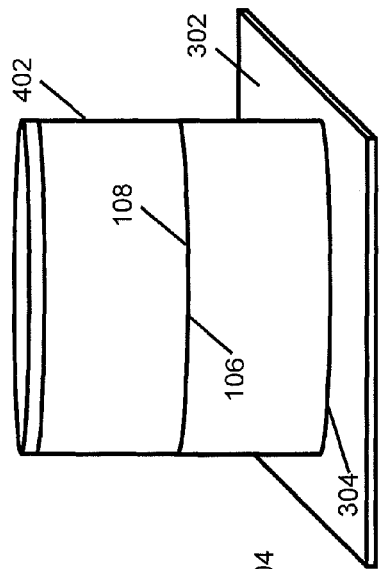
FIG. 5A
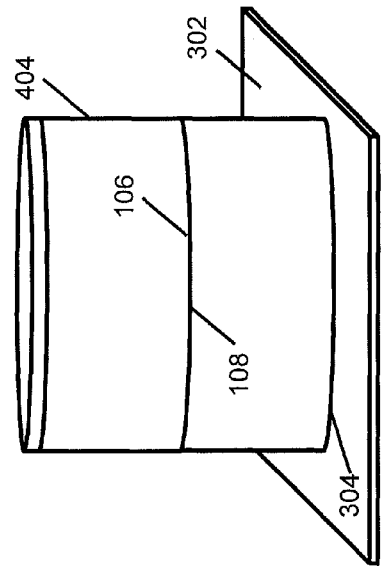
FIG. 5B
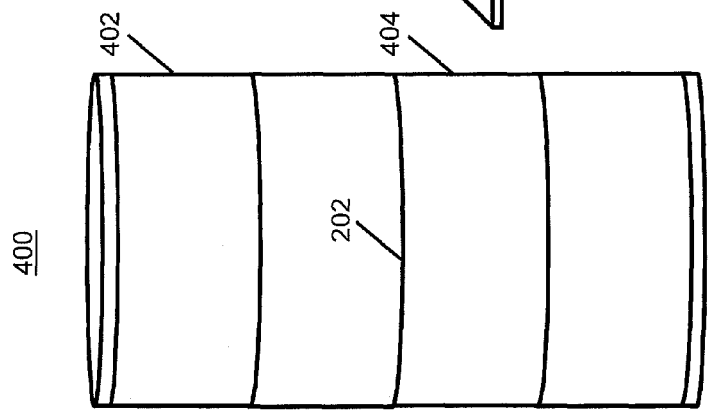
FIG. 4B
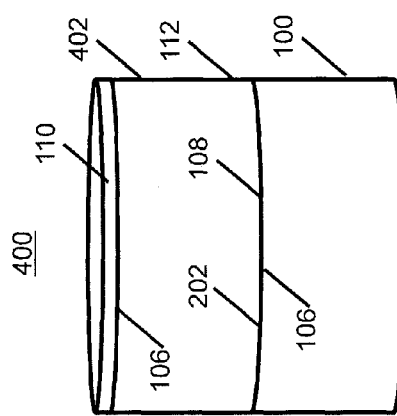
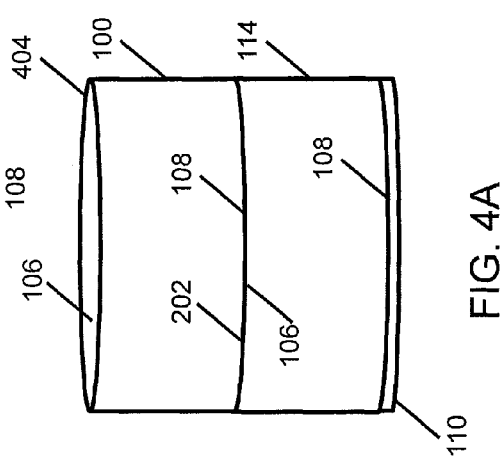
FIG. 4A

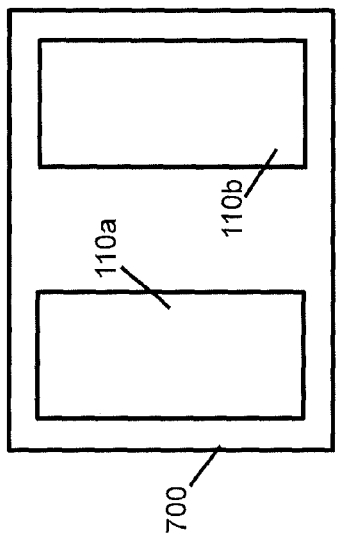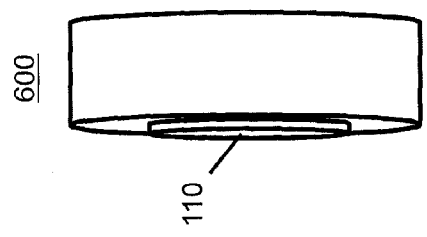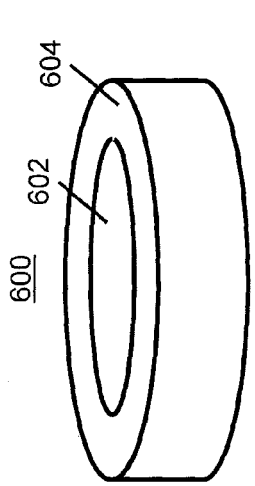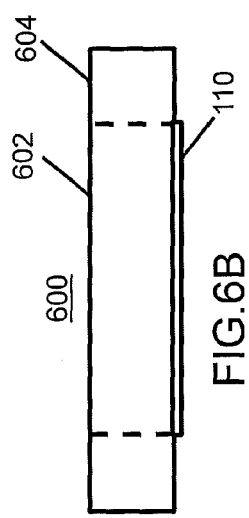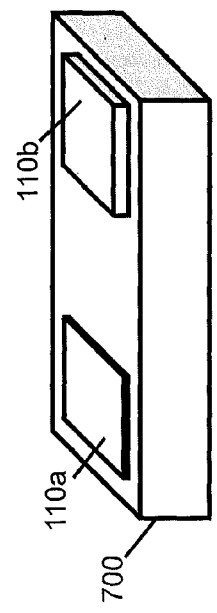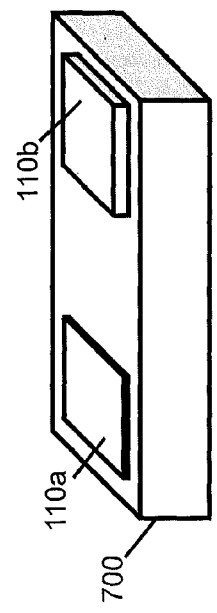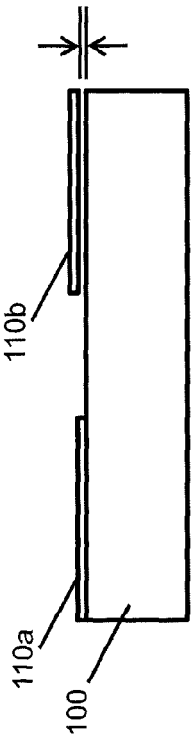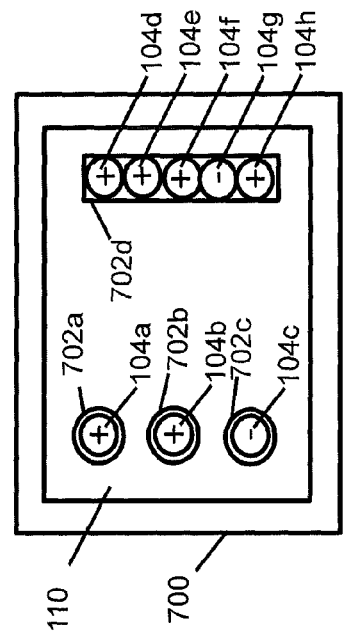

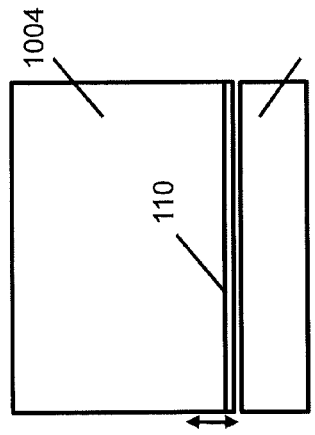
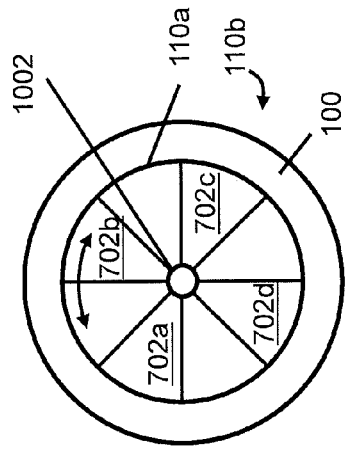
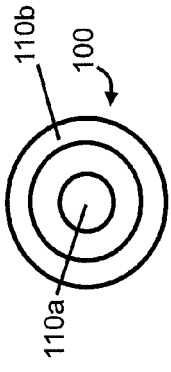
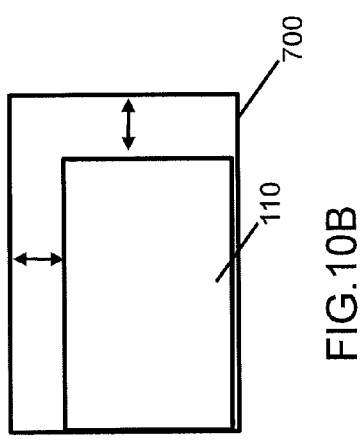
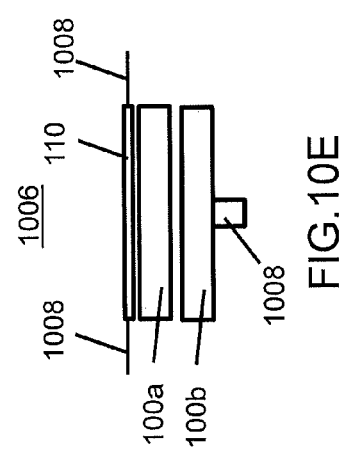
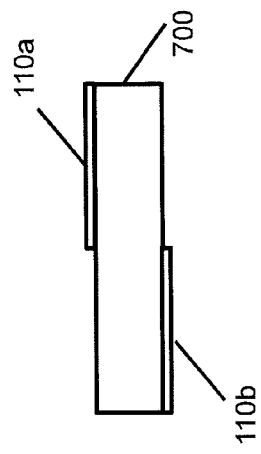
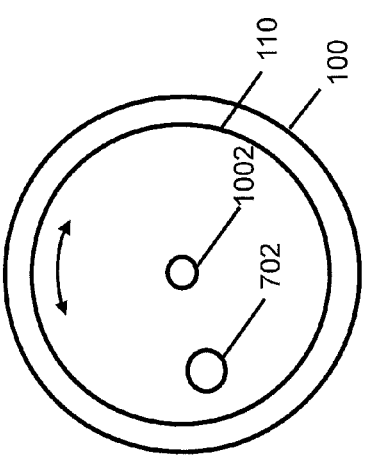
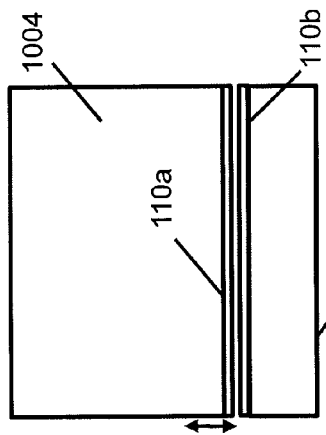

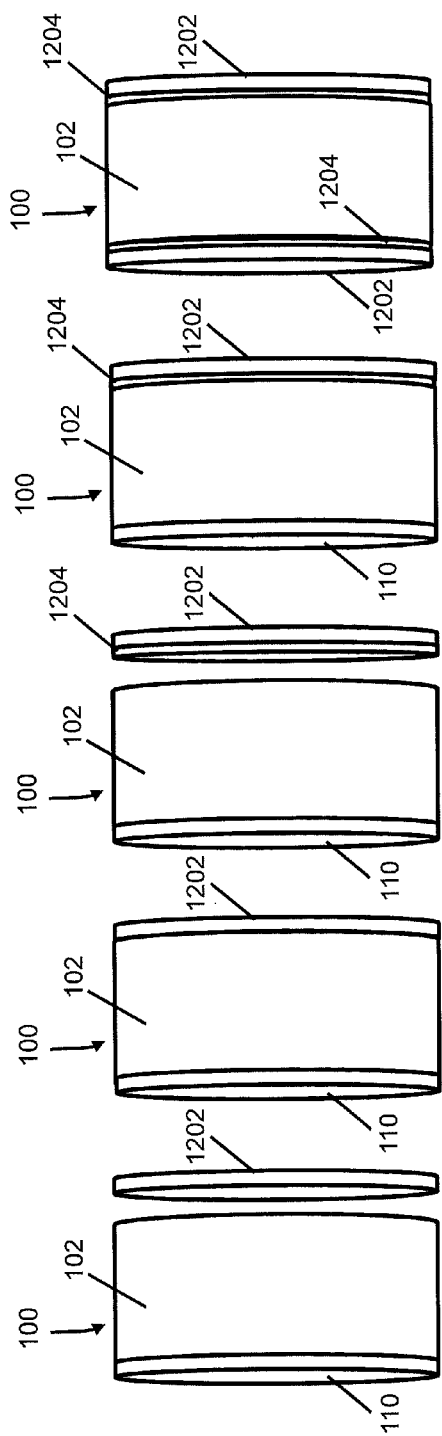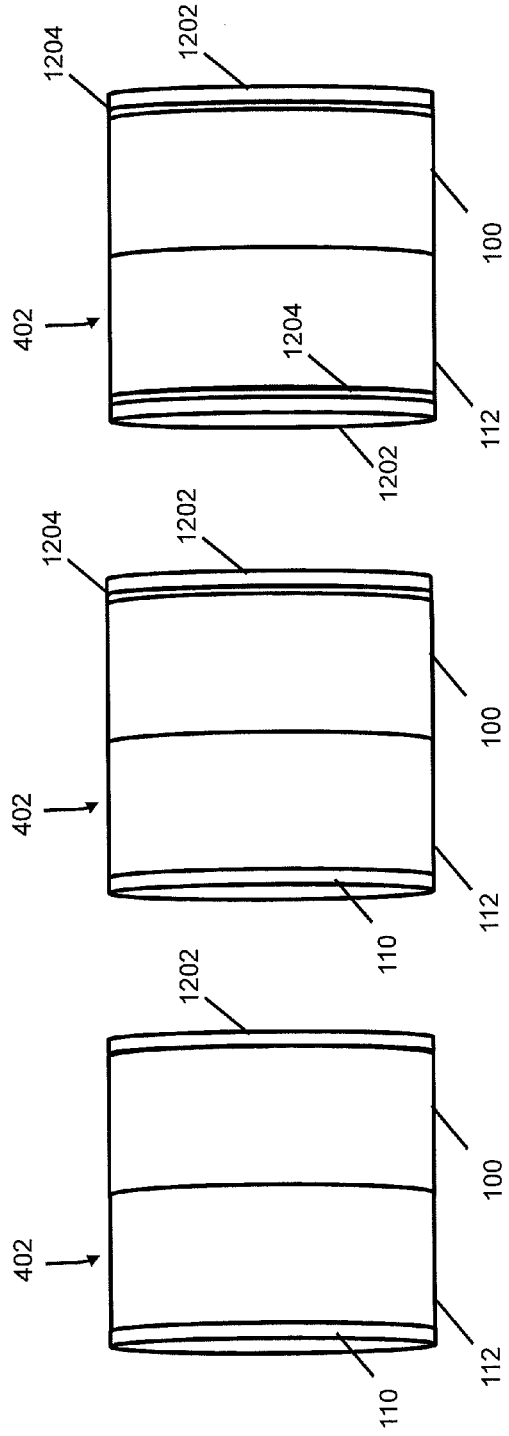

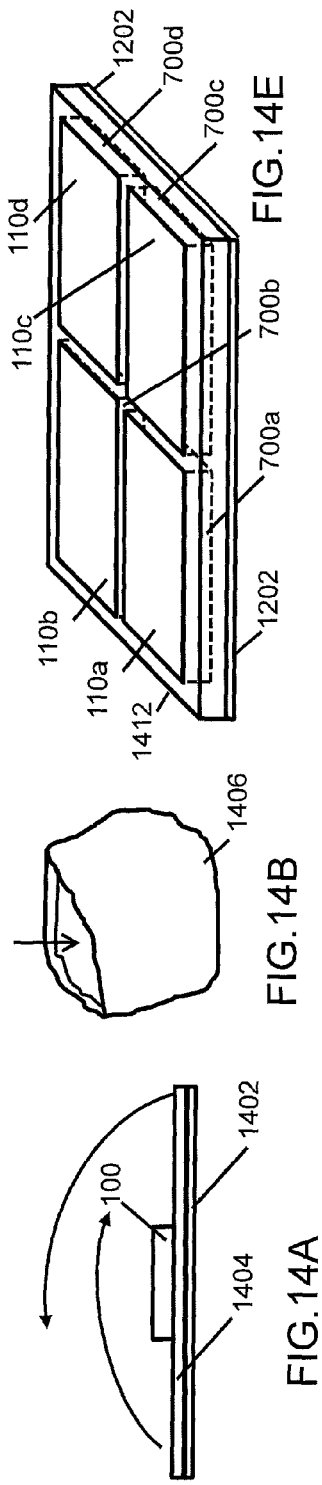

SYSTEM AND METHOD FOR AFFECTING FLUX OF MULTI-POLE MAGNETIC STRUCTURES

CLAIMING BENEFIT OF PRIOR FILED U.S. APPLICATIONS

This patent application is a continuation application of U.S. patent application Ser. No. 13/374,074 filed Dec. 9, 2011, now pending, which claims the benefit of U.S. Provisional Patent Application 61/459,329, filed Dec. 10, 2010, and U.S. Provisional Patent Application 61/459,994, filed Dec. 22, 2010. The contents of these two provisional patent applications are hereby incorporated by reference in their entirety herein.

FIELD OF THE INVENTION

The present invention relates generally to a system and method for affecting flux of multi-pole magnetic structures. More particularly, the present invention relates to a system and method for using shunt plates to route flux of multi-pole magnetic structures.

BACKGROUND OF THE INVENTION

Back plates have been used with conventional dipole magnets to provide magnetic circuits between the two poles of the magnets, where the two poles are on opposite sides of the magnets. Specifically, a typical back plate consists of a cup-shaped piece of metal that is in contact with a first side (also referred to as a surface or face) of a magnet having a pole with a first polarity (in this non-limiting example a North Pole). Side portions of the cup extend around and very near (but not making contact with) the outer boundary of a second side of the magnet having a second polarity (in this non-limiting example a South Pole). As such, the conventional magnet back plate provides a magnetic circuit that causes some or all of the magnetic flux produced by the North Pole of the magnet to be routed near the outer boundary of the South Pole of the magnet, thereby providing a greater magnetic flux density near the South Pole of the magnet. That increased flux density can, for example, increase the holding force when the South Pole and the rim of the cup (i.e., rim of the back plate) are attached to metal. Flux and flux density are well-known concepts to one of skill in the art. A conventional back plate may also be referred to as back iron.

Keepers have been used to preserve the magnetic flux in conventional magnets. Specifically, keepers have been used to provide magnetic paths between opposite poles at both ends of two parallel, conventional bar magnets. Similarly, keepers have been used to provide magnetic paths between opposite poles of conventional horseshoe magnets. Generally, by providing a magnetic path (which may be referred to as a magnetic circuit or a short) between the poles of magnets, the lifetime of such magnets can be extended.

SUMMARY OF THE INVENTION

Briefly, the present invention is an improved system and method for affecting flux of multi-pole magnetic structures. The invention generally pertains to the use of a thin metal or other flux-conducting shunt plate for routing flux from a flux-emitting pole of a magnet element (which may be a magnetic region of a larger magnet substrate, referred to as a maxel, or alternatively may be a discrete magnet structure disposed in an array of a plurality of magnets) to the flux-receiving opposite pole of one or more additional maxels, where the flux then passes through the magnetic material to the other side of the magnetic structure. The flux may then be emitted from the other side of the magnetic structure by a flux emitting pole into the air, or into another magnet, or into ferromagnetic material, or into a sensor, or otherwise utilized for some purpose.

In accordance with one embodiment of the invention, a system for routing magnetic flux comprises a magnetic structure and a shunt plate. The magnetic structure comprises at least one magnetizable material having a first surface and a second surface and a magnet thickness between said first surface and said second surface. The first surface comprises a plurality of first surface magnetic flux sources and a plurality of first surface magnetic flux destinations. The second surface comprises a plurality of second surface magnetic flux sources and a plurality of second surface magnetic flux destinations. Each first surface magnetic flux source extends into the magnet thickness until it meets a second surface magnetic flux destination, and each first surface magnetic flux destination extends into the magnet thickness until it meets a second surface magnetic flux source. The shunt plate has a shunt plate thickness less than the magnet thickness and provides a magnetic short between a plurality of first surface magnetic flux sources and a plurality of first surface magnetic flux destinations, the magnetic short causing a magnetic flux of a first surface magnetic flux source to be routed through the shunt plate into a first surface magnetic flux destination, wherein said magnetic flux is then routed through the magnetic structure to the second surface of the magnetic structure.

Under one arrangement, the shunt plate thickness is less than half of the magnet thickness. With another arrangement, the shunt plate thickness is less than one quarter of the magnet thickness. The shunt plate thickness can be less than a tenth of an inch thick. The shunt plate thickness can be less than a hundredth of an inch thick.

The routing of the magnetic flux from the first side to the second side can increase the magnetic flux density at the second side of the magnetic structure.

The shunt plate thickness can be selected so that the shunt plate only allows ten percent or less leakage of magnetic flux through the shunt plate.

The shunt plate thickness can be selected by determining the integrated flux across a magnetic source of the magnetic structure such that the corresponding flux density in the shunt plate does not substantially exceed the flux density saturation level of a cross section of the shunt plate.

The shunt plate can be attached to the magnetic structure. For example, the shunt plate can be attached magnetically, attached using an adhesive, or attached via compression as result of a fixture interfacing with the magnetic structure.

The shunt plate may comprise a layer of metal applied to the first side of the magnetic structure using one of a thin-film deposition technique, a vapor deposition technique, or a sputter deposition technique.

The shunt plate may comprise a layer of metal applied to the first side of the magnetic structure using one of an electroplating technique, a vacuum arc technique, or a plasma deposition technique.

The shunt plate may comprise powdered metal sintered onto a surface of magnetizable material during its manufacture.

The shunt plate may comprise powdered metal within at least one of a paint material or an adhesive material.

The shunt plate may have at least one hole.

The shunt plate can be movable relative to the magnetic structure.

The shunt plate may rotate relative to an axis or may move translationally.

The shunt plate can be flexible.

The shunt plate can be removable.

In accordance with another embodiment of the invention, a system for routing magnetic flux comprises a magnetic structure having a magnet thickness, the magnetic structure comprising a plurality of magnetic sources, the plurality of magnetic sources including opposite polarity magnetic sources having an opposite polarity orientation, the magnetic structure having a first side and a second side, the second side being opposite the first side, the plurality of magnetic sources extending from the first side of the magnetic structure to the second side of the magnetic structure; and a shunt plate associated with the first side of the magnetic structure, the shunt plate providing a magnetic short between opposite polarity magnetic sources on the first side of the magnetic structure, the magnetic short causing a magnetic flux of the opposite polarity magnetic sources to be routed from the first side of the magnetic structure through the magnetic structure to the second side of the magnetic structure, the shunt plate having a shunt plate thickness less than the magnet thickness, where the second thickness can be selected by determining the integrated flux across a magnetic source of the magnetic structure such that the corresponding flux density in the shunt plate does not substantially exceed the flux density saturation level of a cross section of the shunt plate.

In accordance with another embodiment of the invention, a method for routing flux includes the steps of providing a magnetic structure comprising at least one magnetizable material having a first surface and a second surface, and a magnet thickness between the first surface and said second surface, the first surface comprising a plurality of first surface magnetic flux sources and a plurality of first surface magnetic flux destinations, the second surface comprising a plurality of second surface magnetic flux sources and a plurality of second surface magnetic flux destinations, wherein each first surface magnetic flux source extends into the magnet thickness until it meets a second surface magnetic flux destination and each first surface magnetic flux destination extends into the magnet thickness until it meets a second surface magnetic flux source, selecting a shunt plate permeability, selecting a shunt plate thickness that is less than the magnet thickness and providing a shunt plate having the shunt plate permeability and the shunt plate thickness, the shunt plate imparting a magnetic short between a plurality of first surface magnetic flux sources and a plurality of first surface magnetic flux destinations, the shunt plate causing a magnetic flux of a first surface magnetic flux source to be routed through the shunt plate into a first surface magnetic flux destination, where the magnetic flux is routed through the magnetic structure to the second surface of the magnetic structure.

The shunt plate thickness can be selected by determining the integrated flux across a magnetic source of said magnetic structure such that the corresponding flux density in the shunt plate does not substantially exceed the flux density saturation level of a cross section of the shunt plate.

The shunt plate thickness can be selected such that a flux density at a predetermined location is reduced.

The shunt plate permeability can be selected by determining the integrated flux across a magnetic source of said magnetic structure such that the corresponding flux density in the shunt plate does not substantially exceed the flux density saturation level of a cross section of the shunt plate.

The shunt plate permeability can be selected such that a flux density at a predetermined location is reduced.

The said shunt plate permeability and said shunt plate thickness can be selected such that a flux density at a predetermined is reduced.

The shunt plate permeability and said shunt plate thickness can be selected by determining the integrated flux across a magnetic source of said magnetic structure such that the corresponding flux density in the shunt plate does not substantially exceed the flux density saturation level of a cross section of the shunt plate.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

FIG. 1A' depicts exemplary flux lines between two exemplary magnet structures attached to an exemplary shunt.

FIG. 1B depicts a top view of an exemplary round magnetic structure produced by magnetizing multiple magnetic sources (i.e., maxels) into magnetizable material;

FIG. 1C depicts an oblique view of the exemplary round magnetic structure of FIG. 1B;

FIG. 1D depicts another exemplary square magnetic structure like that of FIG. 1B produced by placing discrete magnets into a frame having holes for accepting the discrete magnets;

FIG. 1E depicts an exemplary round magnetic structure having a polarity pattern that is complementary to the polarity pattern of FIG. 1B;

FIG. 1F depicts a side view of the round magnetic structure of FIG. 1B;

FIG. 1G depicts an exemplary shunt plate of the present invention;

FIG. 1H depicts an exemplary round magnetic structure having a shunt plate attached on a first side of the round magnetic structure of FIG. 1B;

FIG. 1I depicts another exemplary round magnetic structure having a shunt plate attached to a second side of the round magnetic structure of FIG. 1B;

FIG. 4A depicts two stacks of two round magnetic structures each having complementary patterns on their opposing unshunted faces;

FIG. 4B depicts the two stacks of FIG. 4A having been aligned to achieve attachment with a peak attractive force;

FIGS. 5A and 5B depict the two stacks of two round magnetic structures of FIGS. 4A and 4B attached to metal;

FIG. 6A depicts a round magnetic structure having a first region and a second region;

FIG. 6B depicts a shunt plate covering the first region of the round magnetic structure of FIG. 6A;

FIG. 6C depicts a side view of the round magnetic structure and shunt plate of FIG. 6B;

FIG. 7A depicts an exemplary rectangular magnetic structure having two shunt plates covering two portions of its surface;

FIG. 7B depicts use of two shunt plates having different thicknesses;

FIG. 8 depicts use of holes in a shunt plate that can correspond to one or more magnetic sources of a magnetic structure to which the shunt plate is associated;

FIG. 9 depicts use of two shunt plates being different distances from the face of the magnetic structure;

FIG. 10A depicts the exemplary round magnetic structure of FIG. 1B having a moveable shunt plate that can rotate relative to an axis and having a hole that would move relative to the structure as the shunt plate is rotated;

FIG. 10B depicts the exemplary rectangular magnetic structure of FIG. 7A having a movable shunt plate configured for translational movement relative to the magnetic structure;

FIG. 10C depicts the exemplary rectangular magnetic structure of FIG. 7A and a shunt plate associated with an object that can be moved so that the shunt plate can be brought into contact with the structure or moved away from the structure;

FIG. 10D depicts the exemplary rectangular magnetic structure of FIG. 7A and a first shunt plate associated with an object that can be moved so that the first shunt plate can be brought into contact with a second shunt plate associated with the structure or moved away from the second shunt plate associated with the structure;

FIG. 10E depicts an exemplary transducer;

FIG. 11A depicts the use of shunt plates on two sides of a magnetic structure;

FIG. 11B depicts the use of rotatable shunt plates on two sides of a round magnetic structure 100;

FIG. 11C depicts the use of two shunt plates to shunt maxels in a first round center portion and maxels in an outer ring portion of a round magnetic structure;

FIG. 12A depicts a magnetic structure having a shunt plate and a nearby removable shunt plate, which could also be referred to as a cover shield;

FIG. 12B depicts the magnetic structure having a shunt plate and removable shunt plate of FIG. 12A, where the removable shunt plate has been placed against the magnetic structure 100 thereby substantially shielding all the flux of the magnetic structure;

FIG. 12C depicts the magnetic structure having a shunt plate and a nearby removable shunt plate of FIG. 12A, where removable shunt plate has a non-metallic spacer;

FIG. 12 D shows magnetic structure of FIG. 12C when the spacer and shunt plate are brought in contact with each other.

FIG. 12E depicts use of two cover shields having spacers to provide shielding to a magnetic structure;

FIG. 13A depicts a stacked magnetic structure and an attached cover shield not having a spacer;

FIG. 13B depicts a stacked magnetic structure and an attached cover shield having a spacer;

FIG. 13C depicts a stacked magnetic structure having two attached cover shields each having a spacer;

FIG. 14A depicts a flexible removable shunt plate and a corresponding foldable spacer layer;

FIG. 14B depicts an exemplary storage pouch for storing a multi-pole magnetic structure;

FIG. 14C depicts exemplary multi-pole magnetic structure storage using cover shields and spacers;

FIG. 14D depicts exemplary multi-pole magnetic structure storage of multiple magnetic structures using two cover shields and container portions designed to receive the multiple magnetic structures and to provide spacing between the structures and the cover shields;

FIG. 14E depicts an alternative approach for multi-pole magnetic structure storage that is similar to that described for FIG. 14D;

DETAILED DESCRIPTION OF THE INVENTION

Figure 1A:
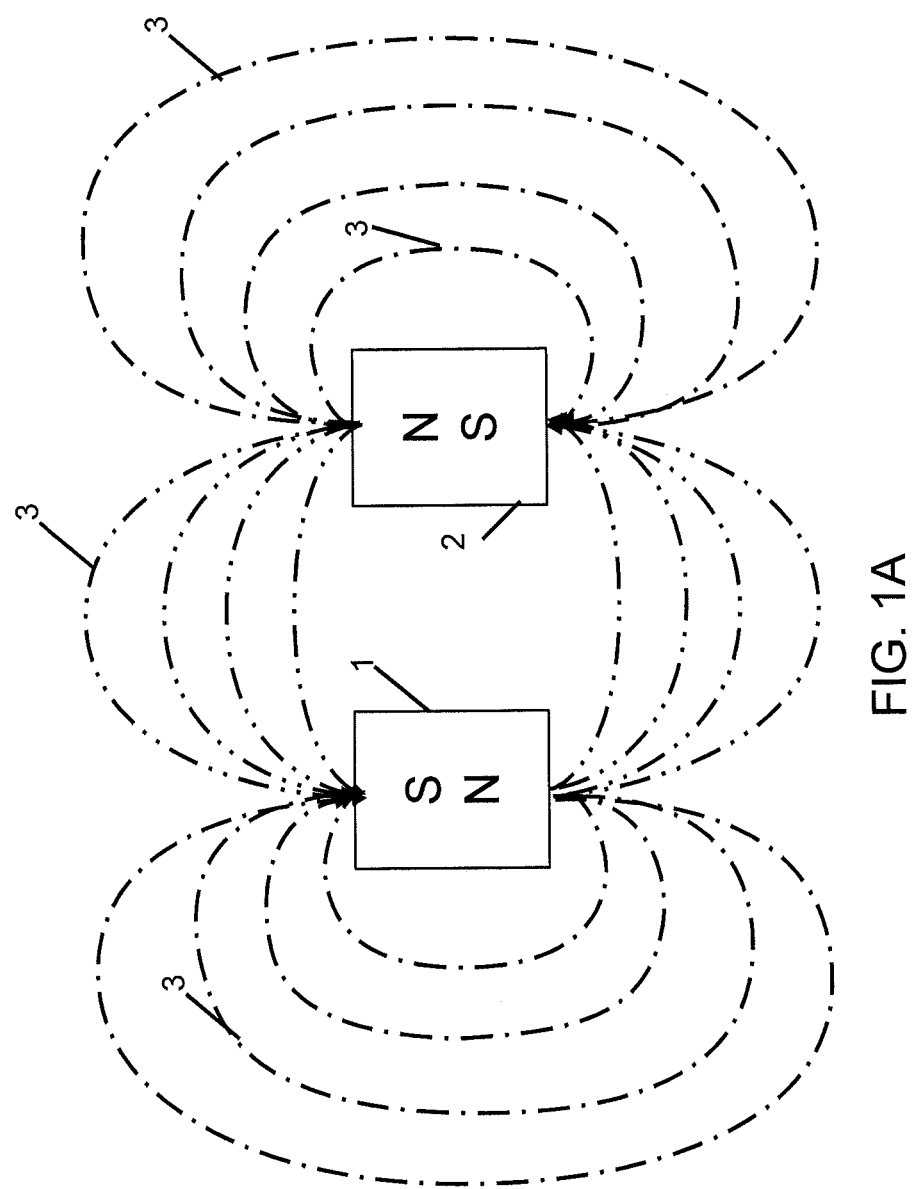
FIG. 1A depicts exemplary flux lines between two magnet structures.

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in the art.

The present invention provides a system and method for affecting flux of multi-pole magnetic structures. It involves magnetic techniques related to those described in U.S. Pat. No. 7,800,471, issued Sep. 21, 2010, U.S. Pat. No. 7,868,721, issued Jan. 11, 2010, U.S. patent application Ser. No. 12/476,952, filed Jun. 2, 2009, and U.S. Pat. No. 7,982,568, issued Jul. 19, 2011, which are all incorporated herein by reference in their entirety. The present invention is applicable to systems and methods described in U.S. Pat. No. 7,681,256, issued Mar. 23, 2010, U.S. Pat. No. 7,750,781, issued Jul. 6, 2010, U.S. Pat. No. 7,755,462, issued Jul. 13, 2010, U.S. Pat. No. 7,812,698, issued Oct. 12, 2010, U.S. Pat. Nos. 7,817,002, 7,817,003, 7,817,004, 7,817,005, and 7,817,006, issued Oct. 19, 2010, U.S. Pat. No. 7,821,367, issued Oct. 26, 2010, U.S. Pat. Nos. 7,823,300 and 7,824,083, issued Nov. 2, 2010, U.S. Pat. No. 7,834,729, issued Nov. 16, 2010, U.S. Pat. No. 7,839,247, issued Nov. 23, 2010, and U.S. Pat. Nos. 7,843,295, 7,843,296, and 7,843,297, issued Nov. 30, 2010, and U.S. patent application Ser. No. 12/322,561, filed Feb. 4, 2009, U.S. Pat. No. 7,893,803, issued Feb. 22, 2011, U.S. Pat. Nos. 7,956,711 and 7,956,712, issued Jun. 7, 2011, U.S. Pat. Nos. 7,958,575 and 7,961,068, issued Jun. 14, 2011, U.S. Pat. No. 7,963,818, issued Jun. 21, 2011, and U.S. Pat. Nos. 8,015,752 and 8,016,330, issued Sep. 13, 2011, and U.S. Pat. No. 8,035,260, issued Oct. 11, 2011, which are all incorporated by reference herein in their entirety. The invention may also incorporate techniques described in U.S. Provisional Patent Application 61/455,820, which is also incorporated by reference herein in its entirety.

In accordance with one embodiment of the present invention, one or more shunt plates (or shielding plates) are associated with a shunted (or shielded) first side of a multi-pole magnetic structure, where a shunt plate is a thin metal layer that provides a magnetic short between opposite polarity magnetic sources (or maxels) making up the first side of the structure. The one or more shunt plates serve to cause the magnetic flux of the shunted maxels of the first side of the magnetic structure to be routed through the magnetic structure to a non-shunted (or non-shielded) second side of the magnetic structure thereby [concentrating the density of the] magnetic flux present near the surface of the second side of the magnetic structure. It can be referred to as a shield in that much or all of the flux generated by the maxels that would otherwise extend for a distance into the space surrounding the magnetic structure can instead be conducted through the shunt plate to an area of opposite polarity, meaning that the area beyond the shunt plate has a weaker magnetic field than it would absent the shunt plate. The thickness of a shunt plate can be on the order of a few hundredths or even a few thousands of an inch depending on the size (i.e., cross-sectional area) of the magnetic sources (maxels) making up a multi-pole magnetic structure, where the smaller the magnetic sources the thinner an effective shunt plate can be. A shunt plate could be, for example, a 0.029" thick layer of a 1006 steel alloy attached to one face of a magnetic structure of maxels printed into a ⅛" thick neodymium iron boron (NIB) magnetizable material. Generally, any ferromagnetic material having the ability to conduct magnetic flux better than air could be used for a shunt plate in accordance with the present invention, where it is desirable to select a ferromagnetic material that can achieve the appropriate shunting characteristics at a desired thickness. One skilled in the art will recognize that soft iron or any of various types of steel alloys or any other ferromagnetic material or alloy can be employed.

The shunt plate of the present invention is unlike a back plate in that it does not and it is not intended to provide a circuit between the two poles of a dipole magnet. A shunt plate is also unlike a keeper in that it does not provide a closed circuit between poles of a dipole horseshoe magnet, nor does it provide closed magnetic paths at both ends of two parallel bar magnets. Moreover, its purpose is to route magnetic flux from one side of a multi-pole magnetic structure through the material making up the magnetic structure to the other side of the magnetic structure, as opposed to primarily routing the flux around the outer edges of the magnetic structure.

In accordance with a second embodiment of the invention, the thickness of a shunt plate can be selected by determining the integrated flux across a magnetic source (i.e., maxel) of the magnetic structure, where the integrated flux is constrained by the cross section of the metal making up the shunt plate such that the corresponding flux density in the shunt plate does not substantially exceed the flux density saturation level of the cross section of the metal. Generally, the amount of flux density allowed to exceed the flux density saturation level of the cross section of the metal is a design decision. For example, for a given cost of materials, application environment, etc. it might be considered reasonable to allow up to 10% leakage of flux through the shunt plate, while for another scenario it might be desirable that very little flux leakage occur. The flux leakage can be tailored for the particular application. For example, an application environment may limit the magnetic field strength at a given distance from the magnetic source, such as may be the case with instrumentation that is sensitive to magnetic fields, and the shunt plate of the present invention can be specified to decrease the field strength at that predetermined distance by the percentage necessary to hit the target field strength, even if that is only a small reduction in field strength.

FIG. 1A depicts exemplary flux lines 3 between two exemplary discrete magnets 1 and 2. The flux lines 3 are illustrated as being emitted from the North Pole of each of magnets 1 and 2 and received by the South Poles of each of the magnets 1 and 2. Within the magnets 1 and 2, and not depicted in this drawing, flux lines are considered to flow from the South Pole to the North Pole. Flux lines 3 form closed loops from pole to pole. They are considered to have direction as if flowing, though no actual movement occurs. Flux lines typically become less dense with increasing distance from the poles, though permeability of the material through which the flux lines pass impacts flux line density. One skilled in the art will recognize that the flux lines 3 depicted in FIGS. 1A and 1A' are merely approximations intended for comparison.

FIG. 1A' depicts exemplary flux lines 3 between two exemplary discrete magnets 1 and 2 to which an exemplary shunt plate 4 has been attached. The flux lines 3 are emitted by the North Pole of magnet 1. Some of the flux lines travel through the shunt plate 4, which in this example has higher permeability than air, into the South Pole of magnet 2. Those flux lines then pass through magnet 2 from South to North, where they are emitted into the air and received by the South Pole of Magnet 1. The flux lines pass from the South Pole of magnet 1 to the North Pole of magnet 1, thereby completing a closed loop. For illustrative purposes, FIG. 1A' also depicts flux lines traveling through the air on the sides of each of magnets 1 and 2, connecting the North and South poles of those respective magnets. For illustrative purposes, FIG. 1A' depicts shunt plate 4 being fully saturated, and thereby depicts at least some flux leakage through shunt plate 4.

FIG. 1B depicts a top view of an exemplary round magnetic structure 100 producing by magnetizing multiple magnetic sources (or maxels) 104 into magnetizable material 102. The polarity pattern shown in FIG. 1B is in accordance with a code that defines the spatial force function of the depicted first side 106 of the magnetic structure 100.

FIG. 1C depicts an oblique view of the exemplary round magnetic structure 100 of FIG. 1B.

FIG. 1D depicts another exemplary square magnetic structure 100 like that of FIG. 1B produced by placing discrete magnets into a frame 107 having holes for accepting the discrete magnets. The frame 107 would typically be a non-magnetizable material such as a hard plastic whose purpose is to hold the discrete magnets in their desired pattern. The structure of FIG. 1D is shown having a first side 106 having discrete magnetic sources that have the same polarity pattern accordance with the same code used to define the polarity of the maxels of the structure of FIGS. 1B and 1C. Generally, references to patterns of maxels below are comparable to patterns of discrete magnets.

FIG. 1E depicts an exemplary round magnetic structure 100 having a polarity pattern that is complementary to the polarity pattern of FIG. 1B. The structure of FIG. 1E could be the face 108 of a second structure, or it could be the opposite side 108 of the magnetic structure of FIGS. 1B and 1C. Similarly, the polarity pattern depicted for the structure of FIG. 1E is the same as the opposite side 108 of the structure of FIG. 1D. A magnetic source, whether a discrete magnet or a maxel printed into magnetizable material, will typically extend from one side of a magnetic structure to the opposite side of the structure and will thus have a first polarity on one side of a magnetic structure and have an opposite polarity on the opposite side of the structure.

FIG. 1F depicts a side view of the round magnetic structure 100 of FIG. 1B. As depicted, the structure 100 has a first side 106 and a second side 108, where the polarity pattern of the magnetic sources of the first side 106 is complementary to the polarity pattern of the magnetic sources of the second side 108. Moreover, the structure 100 is shown to be a magnetizable material 102 in which maxels (not shown) have been printed. For the remainder of this specification, exemplary magnetic structures are described involving maxels 104 printed into magnetizable material 102. However, one skilled in the art will recognize that such exemplary magnetic structures can also be implemented using non-magnetizable material acting as a frame for holding discrete magnets. Furthermore, instead of a frame that provides holes for accepting discrete magnets, the magnets can instead be attached to a substrate. Additionally, one could use adhesive, nuts and bolts, threads, or any conventional attachment means whereby the polarity orientation of the discrete magnets is maintained.

FIG. 1G depicts an exemplary shunt plate 110 of an exemplary embodiment of the present invention. The shunt plate 110 will typically comprise a material that provides a direct short between two or more maxels of opposite polarity where for cost reasons it is desirable that the material be as thin as possible while sufficiently shunting flux between maxels such that flux does not substantially penetrate the shunt plate 110. In other words, the thickness of the metal can be selected to achieve an appropriate balance between cost of the shunt plate versus flux leakage through the shunt plate. For example, with a piece of 1/32" (or 0.03125") thick grade 42 NIB magnetizable material, a shunt plate 110 of a 1006 steel alloy as thin as 0.007" was shown to substantially shunt the flux between opposite polarity maxels. For this example, the thickness of the shunt plate is less than 25% of the thickness of the magnetizable material, but depending on the shunting characteristics of the material making up the shunt plate, the relative thickness of the shunt plate to the thickness of the magnetizable material may be greater than 25%, for example 40%. Generally, however, the ability of the shunt plate to route magnetic flux through a magnetic structure instead of around the magnetic structure enables relatively thin shunt plates to function comparably to thicker back iron, where the ratio of thickness of shunt plate versus the thickness of a comparable back iron decreases as the surface area of magnetizable material increases. As such, the thickness of a shunt plate can be less than the thickness of a given magnetizable material whereas a comparable back iron will typically be greater than the thickness of a given magnetizable material. Moreover, the weight and volume of a shunt plate can be substantially less than the weight and volume of a comparable back iron, enabling the use of shunt plates in applications for which a relatively heavy and bulky back iron would not be feasible.

The shape of the shunt plate 110 can generally be configured to correspond to the shape of all or a portion of one side of a magnetic field structure. The shunt plate 110 may be attached to a magnetic structure magnetically, attached using an adhesive, via compression as a result of a fixture interfacing with the structure, or by other means. Moreover, a shunt plate may be applied to the magnetizable material using a thin-film deposition technique, a vapor deposition technique, or sputter deposition technique (e.g., RF or DC). A shunt plate can alternatively be applied using a metalizing technique. Under one exemplary arrangement, a thin layer of iron is applied to one side of a magnetizable material using an electroplating technique. Such an exemplary arrangement could alternatively or in addition employ a vacuum arc technique or a plasma deposition technique, depending on the material being used as a shunt plate in a particular application. Under another arrangement, powdered iron (or another metal) is sintered onto the surface of the magnetizable material during its manufacture. Alternatively, a paint material and/or an adhesive material containing powdered iron (or another metal) could be applied to a surface of the magnetic structure prior to or after its magnetization.

FIG. 1H depicts an exemplary round shunted magnetic structure 112 comprising a shunt plate 110 attached on a first side 106 of the round magnetic structure 100 of FIG. 1B.

FIG. 1I depicts another exemplary round shunted magnetic structure 114 comprising a shunt plate 110 attached to a second side 108 of the round magnetic structure 100 of FIG. 1B. As such, the maxels of the non-shunted sides of the shunted magnetic structures 112, 114 have complementary polarity patterns.

Figure 2A:
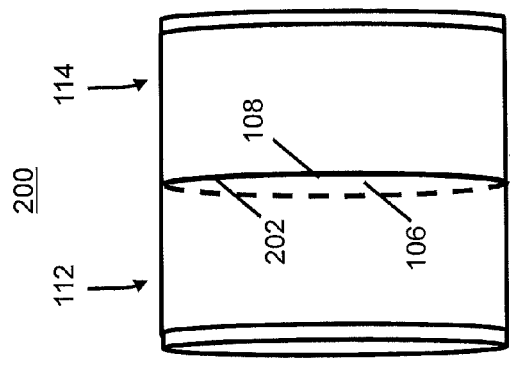
FIG. 2A depicts the round magnetic structures of FIGS. 1H and 1I having complementary patterns on their opposing non-shunted faces.

FIG. 2A depicts the round shunted magnetic structures 112, 114 of FIGS. 1H and 1I having complementary patterns on their opposing non-shunted sides 106, 108.

Figure 2B:
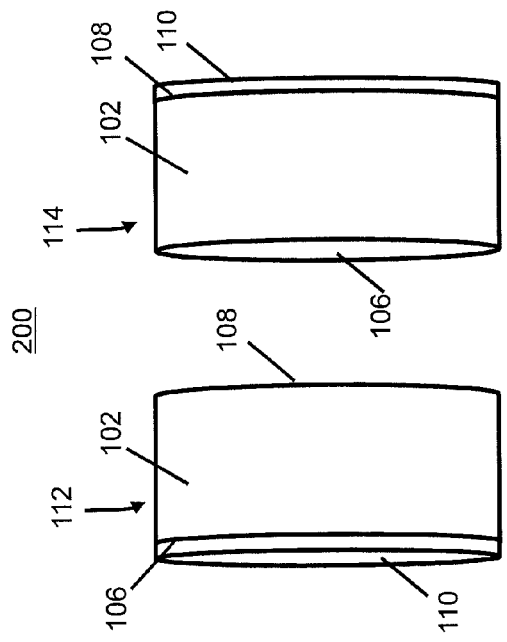
FIG. 2B depicts the structure of FIGS. 1H and 1I having been aligned to achieve attachment.

FIG. 2B depicts the shunted structures 112, 114 of FIGS. 1H and 1I having been oriented such that the complementary maxels 104 of the two opposing faces 106, 108 are aligned to correlate to thereby achieve attachment. As depicted, the two shunted structures 112, 114 are attached along a magnet-to-magnet attachment boundary 202.

Figure 3:
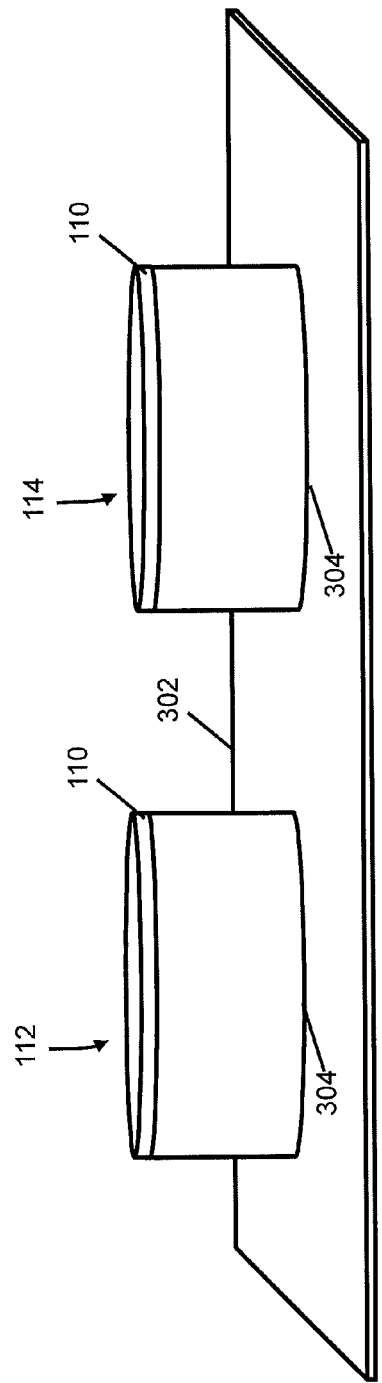
FIG. 3 depicts the round magnetic structures of FIGS. 1H and 1I attached to metal.

FIG. 3 depicts the round shunted magnetic structures 112, 114 of FIGS. 1H and 1I attached to metal 302. As depicted, the two shunted structures 112, 114 are each attached along a magnet-to-metal attachment boundary 304. Each maxel 104 of either shunted structure 112, 114 will produce an attractive force when in contact with the metal and the amount of force produced is increased due to the presence of the shunt plates 110.

FIG. 4A depicts two shunted stacks 402, 404 each comprising two round magnetic structures 100 having complementary patterns of magnetic sources on their opposing faces 106, 108 (such as the complementary polarity patterns depicted in FIGS. 1B and 1E). Referring to FIG. 4A, the two stacks 402, 404 each comprise a non-shunted magnetic structure 100 attached along a magnet-to-magnet attachment boundary 202 to a corresponding shunted magnetic structure 112, 114. The shunted sides of the shunted magnetic structures have complementary maxel polarity patterns and as a result the non-attached sides of their corresponding attached non-shunted magnetic structures 100 have complementary maxels polarity patterns. Although, two magnetic structures 100 are shown in each shunted stack, three or more magnetic structures can be included in each shunted stack. Moreover, the magnetic structures 100 of the shunted stack need not be round, their individual thicknesses may vary, and they need not completely overlap. Generally, all sorts of shunted stacked magnetic structures are possible.

FIG. 4B depicts the shunted stacked structures 402, 404 of FIG. 4A having been oriented such that the complementary maxels 104 of the two opposing non-shunted faces 106, 108 are aligned to correlate to thereby achieve attachment with a peak attractive force. Referring to FIG. 4B, the two stacks 402, 404 are attached along a magnet-to-magnet attachment boundary 202. One skilled in the art will recognize that a shunted stacked structure can be attached to a shunted magnet that was not a part of a magnet stack prior to attachment. One skilled in the art will also recognize that the complementary maxels of the two opposing non-shunted faces 106, 108 can be misaligned to produce an off peak spatial force or release force thereby enabling the two stacks 402, 404 to be detached from each other.

FIGS. 5A and 5B depict the two stacks 402 404 of FIGS. 4A and 4B attached to metal 302 at a magnet-to-metal attachment boundary 304. Each maxel 104 (or magnetic source) of the shunted stacked structure 402, 404 will produce an attractive force when in contact with the metal 302 and the amount of force produced will be increased due to the presence of the shunt plates 110. One skilled in the art will also recognize that the complementary maxels of the two opposing faces 106, 108 of the two stacks 402 404 can be misaligned to produce an off peak spatial force or release force thereby enabling the magnetic structures 100 and the shunted magnetic structures 112 of the two stacks 402, 404 to be detached from each other thereby leaving the non-shunted structures 100 attached to the metal 302. Thereafter the non-shunted structures 100 can be detached from the metal 302.

FIG. 6A depicts a round magnetic structure 600 having a first region 602 and a second region 604, where the two regions 602, 604 may be magnetized with different patterns. For example, the first region 602 might have a plurality of maxels in accordance with a code while the second region 604 might be conventionally magnetized or could have a different pattern of maxels. Alternatively, the two regions may be magnetized with the same maxel pattern.

FIG. 6B depicts a shunt plate 110 covering the first region 602 on one side of the round magnetic structure 600 of FIG. 6A. As such, the shunt plate 110 causes flux from maxels located in the first region 602 to be concentrated on the side of the structure 600 opposite the side having the shunt plate 110.

FIG. 6C depicts a side view of the round magnetic structure 600 and the shunt plate 110 of FIG. 6B.

FIG. 7A depicts an exemplary rectangular magnetic structure 700 having two shunt plates 110a, 110b covering two portions of its surface. Generally, two or more shunt plates can be used to shunt maxels located in different portions of a magnetic structure.

FIG. 7B depicts use of two shunt plates 110a, 110b having different thicknesses, which can result in a different amounts of shunting between maxels and therefore shielding of the flux produced by those maxels. The thicknesses of multiple shunt plates can vary for all sorts of reasons to include taking into account different coding of the maxels, different field strengths of the maxels, etc. Similarly, different types of metal having different shunting/shielding properties can be used to achieve the same result of using different thicknesses of the same metal. Generally, various combinations of metal types and metal thicknesses can be employed.

FIG. 8 depicts use of holes 702a-702d in a shunt plate 110 that can correspond to one or more maxels 104a-104h of a magnetic structure 700 to which the shunt plate 110 is associated. One skilled in the art will recognize that all sorts of possible combinations of shunted and non-shunted maxels are possible by placing holes in shunt plates in accordance with maxel patterns. As depicted, three holes 702a-702c correspond to three maxels 104a-104c that comprise a Barker 3 code (++−). Similarly, a single hole 702d is about five maxels 104d-104h that comprise a Barker 5 code (+++−+). Generally, holes can be placed in shunt plates based on maxel patterns in order to determine the amount of shunting of the shunt plate and which maxels are shunted. Moreover, the holes purposely enable flux of the non-shunted maxels to escape beyond the shunt plate thereby enabling unshielded magnetic fields to be used for precision attachment, to be measured, which could convey information, or for other purposes. Although the area of a maxel projected onto the face of the magnet structure is shown to be round in the figure, one skilled in the art would recognize that the maxels may have other shapes and that holes may or may not surround a maxel. In other words, a maxel may only be partially exposed by a hole and therefore partially shielded by a shunt plate.

FIG. 9 depicts the use of two shunt plates 110a, 110b that are different distances from the face of the magnetic structure 100. Specifically, a first shunt plate 110a is in contact with the surface, or face, of the magnetic structure 100 and a second plate 110b is some distance away from the magnetic structure as indicated by the two arrows. Generally, one skilled in the art will recognize that the shunting effect of a shunt plate is impacted by the distance it is away from the face of the magnetic structure.

In accordance with another embodiment of the invention, one or more shunt plates can be used to purposely vary (or modulate) one or more magnetic field characteristics of a magnetic structure. Such varied magnetic field characteristics can be measured and can otherwise be used for communications, to produce music, to produce images, or the like. Generally, by varying a characteristic of a shunt plate associated with a magnetic structure, for example the location of the shunt plate relative to the magnetic structure, a corresponding varying of a characteristic of a magnetic field produced by the magnetic structure can be achieved. For example, if a shunt plate characteristic is varied in time in accordance with a code, for example the Morse code, a skilled observer of the pattern of a respective variance in a magnetic field characteristic could be conveyed information. In another example, a shunt plate may be attached to a membrane near a magnetic structure to function as a force transducer, where the membrane can vibrate due to sound waves to modulate a magnetic field used to produce an audio signal, for example an audio signal used to cancel noise.

Additionally, numerous approaches for varying shunt plate characteristics to affect magnetic fields produced by multi-level magnetic structures are also possible such as varying the equilibrium distance for a contactless attachment device or varying the state of a repel snap device from an attached state to a detached state, or vice versa. Multi-level magnetic structures are described in U.S. Pat. No. 7,982,568, which was previously incorporated by reference herein in its entirety. Typically, varying of a shunt plate characteristic can be controlled by a control system, can be a function of movement of person/animal/object, or can be the result of one or more environmental phenomenon (e.g., RF, DC, seismic, etc.).

FIG. 10A depicts the exemplary round magnetic structure 100 of FIG. 1B having a moveable shunt plate 110 that can rotate relative to an axis 1002. The moveable shunt plate 110 has a hole 702 that will move relative to the structure 100 as the shunt plate 110 is rotated. As such, as the shunt plate 110 is rotated, the maxel (or portion of maxels) over which the hole resides will vary thereby affecting the shunting behavior of the shunt plate and also enabling different fields to be measured on the side of the shunt plate, which could convey information, be used for precision attachment, or for other purposes. Although one hole is shown in FIG. 10A, multiple holes, slots, or otherwise open areas can be used with a rotating shunt plate 110. The moveable shunt plate 110 may be in contact with the surface of the structure or be located at some distance away from the surface of the structure. If one or more magnetic field sensors (e.g., a Hall effects sensor) are located near the magnetic structure 100, the output of a given sensor can be made to vary by rotating a moveable shunt plate 110 having one or more holes in it or otherwise having a shape whereby shunting of the maxels of the magnetic structure will vary with rotation. As such, rotating a moveable shunt plate 110 can used as a modulation method.

FIG. 10B depicts the exemplary rectangular magnetic structure 700 of FIG. 7A having a movable shunt plate 110 configured for translational movement relative to the magnetic structure 700. As shown, the shunt plate 110 can move up, down, right, or left. Similarly, moveable shunt plates 110 capable of rotational and translational movement can be implemented. Such moveable shunt plates may or may not include holes. Furthermore, the moveable shunt plate 110 may be in contact with the surface of the structure or be located at some distance away from the surface of the structure. If one or more magnetic field sensors are located near the magnetic structure 700, the output of a given sensor can be made to vary by moving a moveable shunt plate 110 whereby shunting of the magnetic structure will vary with translational movement of the moveable shunt plate 110. As such, translational movement of a moveable shunt plate 110 can be a modulation method.

FIG. 10C depicts the exemplary rectangular magnetic structure 700 of FIG. 7A and a shunt plate 110 associated with another object that can be moved so that the shunt plate 110 can be brought into contact with the structure 700, or near contact with the structure 700, and can be moved away from the structure 700. As such, when the shunt plate is located near or in contact with the surface of the structure 700 it can perform a shunting function but the object 1104 can be moved away from the magnetic structure 700 to stop any shunting by the shunt plate 110. The object 1004 can be a machine, a person, an animal, or any other movable object. One skilled in the art will recognize that varying the distance of the shunt plate 110 relative to the magnetic structure 700 will vary (i.e., modulate) the flux density on the non-shunted surface of the magnetic structure, whereby the flux density will increase as the shunt place is moved towards the surface of the magnetic structure or decrease as the shunt place is moved away from the surface of the magnetic structure.

FIG. 10D depicts the exemplary rectangular magnetic structure 700 of FIG. 7A and a first shunt plate 110a associated with an object 1104 that can be moved so that the first shunt plate 110a can be brought into contact with a second shunt plate 110b associated with the structure 700 or moved away from the second shunt plate 110b associated with the structure 700. As such, the amount of shunting can be increased or decreased by bringing the two shunt plates 110a, 110b together or moving them apart, which can be used as a modulation method.

FIG. 10E depicts an exemplary transducer 1006 comprising a first round magnetic structure 100a having near it a shunt plate 110 that is attached to a membrane 1006. As the membrane 1006 moves due to vibration caused by a vibration source, it modulates the amount of shunting of the maxels of the first round magnetic structure 100a caused by the shunt plate 110 thereby modulating the magnetic field produced on the non-shunted side of the first round magnetic structure 100a and therefore also modulates the associated force produced by the first round magnetic structure 100a and a second round magnetic structure 100b as measured by one or more sensors 1008. Although the sensor 1008 is shown in a location on the side of the second magnetic structure opposite the side of the shunt plate 110, sensors to measure modulation can be located in any of various locations around the two magnetic structures. Moreover, a given sensor 1008 may measure force or may measure field strength. Additionally, the transducer 106 could also cause vibration to the shunt plate 110 and membrane 1006 based on forces between the two magnetic structures 100a 100b. Essentially, one skilled in the art would recognize that the basic approach for using the transducer as a speaker can be applied in reverse to use the transducer as a microphone.

Generally, one or more additional shunt plates 110 can be used to produce a stack of shunt plates 110 in order to increase the shunting (and shielding) of a magnetic structure provided that a given shunt plate is not by itself sufficient to shunt the flux being produced by the maxels to which it is in contact. As such, a first shunt plate might be very thin and providing a first amount of shunting (and shielding), a second very thin shunt plate might provide additional shunting (and shielding), and so on until the combined thickness of the multiple shunt plates is sufficient to completely shunt (and shield) the magnetic flux produced by the maxels of the shunted side of the structure. If, however, a shunt plate is sufficiently thick to completely shunt the maxels of a magnetic structure than adding an additional shunt plate on top of it will not have any appreciable affect. Various approaches can also be employed whereby shunt plates in a stack of two or more shunt plates can move relative to each other (i.e., rotationally and/or translationally) and the different shunt plates may have different holes that might align for certain relative alignments of the shunt plates. Moreover, for a given stack of multiple shunt plates, all sorts of combinations of different shunt plate thicknesses; different numbers, shapes, sizes and locations of holes on shunt plates; different relative spatial alignments of shunt plates; and different spacing from each other and from the surface of a magnetic structure are possible.

FIG. 11A depicts the use of shunt plates 110a, 110b on portions of two sides of a magnetic structure 700. Generally, shunt plates on two sides of a magnetic structure can be used to affect the flux produced by the two sides of the structure. Such shunt plates may or may not be moveable and may or may not include holes.

FIG. 11B depicts the use of rotatable shunt plates 110a, 110b on two sides of a round magnetic structure 100. As shown, a first shunt plate 110a has four pie-shaped holes 702a-702d. The second shunt plate 110b (not shown) could similarly have pie-shaped holes 702a-702d that may or may not rotate whereby the holes of the two shunt plates could be configured to align with each other or to be misaligned with each other. Generally, all sorts of moveable shunt plate combinations with and without holes are possible involving shunt plates on two sides of a magnetic structure 100.

FIG. 11C depicts the use of two shunt plates 110a, 110b to shunt maxels in a first round center portion and maxels in an outer ring portion of a round magnetic structure 100.

In accordance with yet another embodiment of the invention, a shunt plate can be a removable shunt plate, where when it is located against or near a magnetic structure it will shunt and shield the magnetic field produced by the magnetic structure but when it is moved away from the magnetic structure entirely it will no longer shield the magnetic field produced by the magnetic structure.

FIG. 12A depicts a magnetic structure 100 having a shunt plate 110 and a nearby removable shunt plate 1202, which could also be referred to as a cover shield. The removable shunt plate 1202 may be the same as a non-removable shunt plate 110 except that it is not intended to be permanently attached to or otherwise associated with a magnetic structure (stacked or non-stacked).

FIG. 12B depicts the magnetic structure 100 having a shunt plate 110 and removable shunt plate 1202 of FIG. 12A, where the removable shunt plate 1202 has been placed against the magnetic structure 100 thereby substantially shielding all the flux of the magnetic structure. As such, when the removable shunt plate 1202 or cover shield is in place, the magnetic structure 100 can be safely shipped or otherwise handled substantially without regard to the magnetic field of the magnetic structure 100. When desired, the cover shield 1202 can be removed and then the uncovered surface of the magnetic structure 100 can be attached to another magnetic structure 100 or to metal 302.

FIG. 12C depicts the magnetic structure 100 having a shunt plate 100 and a nearby removable shunt plate 1202 of FIG. 12A, where the removable shunt plate 1202 has a non-metallic spacer 1204. When the removable shunt plate 1202 and the spacer 1204 are brought into contact with the magnetic structure 100, as depicted in FIG. 12D, the removable shunt plate 1202 functions as a cover shield but it is easier to remove the removable shunt plate 1202 from the magnetic structure 100 than when it is in direct contact with the magnetic structure 100.

FIG. 12E depicts use of two cover shields 1202 having spacers 1204 to provide shielding to a magnetic structure. Generally, the thickness and other characteristics of a spacer 1204 can be selected to achieve a desired ease of release for a cover shield 1202.

FIG. 13A depicts a stacked magnetic structure and an attached cover shield 1202 not having a spacer 1204. Although FIG. 13A resembles FIG. 2B, they actually differ in that the cover shield 1202 is intended to be removed whereas the corresponding shunt plate 110 of FIG. 2B are generally not intended to be removable during use (although one skilled in the art will recognize that various methods can be used to remove a shunt plate for a magnetic structure). As such, FIG. 2B is intended to depict two attached shunted structures 112, 114, whereas FIG. 13A is intended to depict a shunted structure 112 attached to a magnetic structure 100 having a removable cover shield that functions as a shunt plate while in use (e.g., during transport) but is intended for removal from the magnetic structure to enable the uncovered surface of the stacked structure 402 to be attached to metal 302, a complementary stacked structure 404, etc.

FIG. 13B depicts a stacked magnetic structure 402 and an attached cover shield 1202 having a spacer 1204. Having the spacer 1204 makes the cover shield 1202 easier to remove from the stacked magnetic structure 402.

FIG. 13C depicts a stacked magnetic structure 402 having two attached cover shields 1202 each having a spacer 1204.

In accordance with one aspect of the invention, shunt plates (cover shields) can be used to provide shielding of magnetic fields during storage of multi-pole magnetic structures.

FIG. 14A depicts a flexible removable shunt plate 1402 (or flexible cover shield) and a corresponding flexible spacer layer 1404, which can both be folded around a magnetic structure 100 such that its magnetic field is maintained inside the flexible removable shunt plate 1402 but where the spacer enables the flexible removable shunt plate 1402 to be more easily removed than when the spacer is not used. As such, the flexible removable shunt plate 1402 provides shielding of the magnetic field of the magnetic structure enabling it to be safely stored, carried, etc. One or more additional layers of flexible removable shunt plates 1402 and/or one or more additional layers of flexible spacer layer 1404 can also be used to achieve a desired amount of overall shielding. The use of multiple thinner layers of metal and spacers also enables greater overall flexibility making folding easier. One skilled in the art will recognize that any one of various alternative approaches for employing one or more flexible removable shunt plates 1402 and one or more flexible spacer layers 1404 are possible for shielding a magnetic field produced by a magnetic structure. The use of the flexible spacer layer(s) 1404 is also optional. As such, one or more flexible removable shunt plates 1402 can be used to shield a magnetic field produced by a magnetic structure without using one or more flexible spacer layer(s).

FIG. 14B depicts an exemplary storage pouch 1406 for storing a multi-pole magnetic structure, where the storage pouch 1406 is made of leather, cloth, a thick plastic (e.g., a sealable storage bag), or of some other desired material, and the storage pouch is lined with one or more layers of a flexible shunt plate material. A multi-pole magnetic structure wrapped in a flexible spacer material (or not) can then be placed into the pouch. Alternatively, the pouch may include one or more layers of flexible spacer material on top of the flexible shunt plate material.

FIG. 14C depicts exemplary multi-pole magnetic structure storage using cover shields 1202 and spacers 1204, whereby a first cover shield 1202a is placed into a first container part 1408, a first spacer 1204a is placed on top of the first cover shield 1202a, a rectangular magnetic structure 700 is placed onto the first spacer 1204a, a second spacer 1204b is placed onto the rectangular magnetic structure 700, a second cover shield 1202b is placed onto the second spacer 1204b, and a second container part 1410 is placed on top of the second cover shield 1202b. The container could be made of plastic or cardboard or some other desired material. One skilled in the art will recognize that such storage can be implemented with different shaped container portions, spacer, and cover shields that conform to the shape of a different shaped magnetic structure.

FIG. 14D depicts exemplary multi-pole magnetic structure storage of multiple magnetic structures using two cover shields and container portions designed to receive the multiple magnetic structures and to provide spacing between the structures and the cover shields. Referring to FIG. 14D, a first container portion 1412 has associated with it a first cover shield 1202a. The first container portion 1412 includes four compartments 1414a-1414d for receiving four rectangular magnetic structures 700a-700d, respectively. A second container portion 1416 having an associated second cover shield 1202b also includes four compartments 1418a-1418d for receiving the four rectangular magnetic structures 700a-700d, respectively. As such, the four magnetic structures can be placed into the two container portions and their magnetic fields will be shunted (shielded) for storage purposes. One skilled in the art will recognize that such storage can be implemented with different shaped container portions, compartments, and cover shields that conform to the shape of different shaped magnetic structures.

FIG. 14E depicts an alternative approach for multi-pole magnetic structure storage that is similar to that described for FIG. 14D except the second container portion 1416 and associated second cover shield 1202b is not required because the four magnetic structures 700a-700d each have shunt plates 110a-110d associated with one face. As such, the four shunt plates 110a-110d and the removable shunt plate (cover shield) 1202 combine to provide shielding during storage. A second container portion 1416 could also be used with or without a second cover shield 1202b. One skilled in the art will recognize that such storage can be implemented with different shaped container portions and compartments that conform to the shape of different shaped magnetic structures.

In still another embodiment of the invention, one or more electromagnet devices can be associated with one or more shunt plates to control field characteristics of a magnetic structure.

Figure 15B:
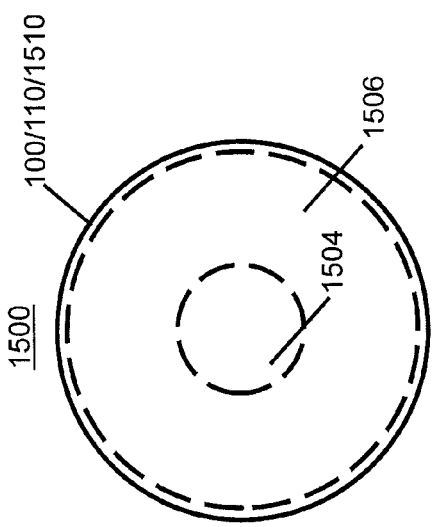
FIG. 15B depicts a top view of the magnetic field control device of FIG. 15A.
Figure 15A:
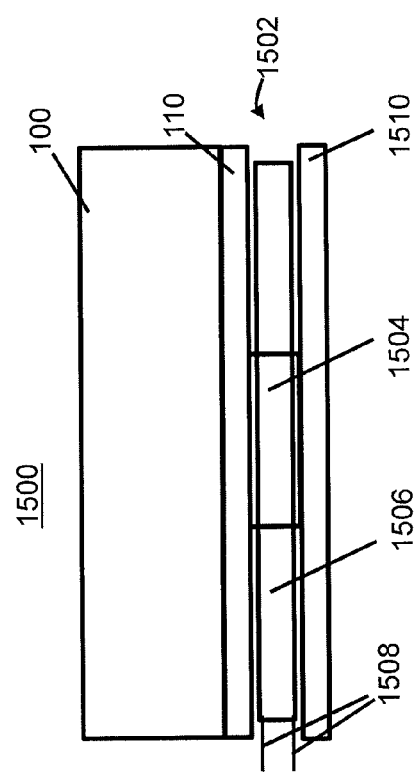
FIG. 15A depicts an exemplary magnetic field control device.

FIG. 15A depicts an exemplary magnetic field control device 1500 comprising a round magnetic structure 100 having an associated shunt plate 110, where a first side of the shunt plate 110 is attached to the magnetic structure 100 and an electromagnet device 1502 is located on the second side of the shunt plate 110. The electromagnet device 1502 includes a core 1504 and a wire coil 1506, where the wire coil 1506 is coiled around the core 1504 and the wire coil 1506 has two wire leads 1508 for applying a current from a current source (not shown). An optional metal plate 1510 can also be used to contain the magnetic field produced by the electromagnet device. When a current is applied to the wire coil 1506, a magnetic field is produced that begins to saturate the shunt plate 110. As the current applied to the wire coil 1506 increases, the magnetic field produced by the electromagnet device 1502 increases to further saturate the shunt plate. As the shunt plate becomes more and more saturated, it provides less and less shunting effect to the magnetic structure 110, where the magnetic flux on the non-shunted side of the magnetic structure 100 also decreases with the amount of saturation of the shunt plate 110 caused by the magnetic field produced by the electromagnet device 1502. When the magnetic field produced by the electromagnet device 1502 fully saturates the shunt plate 110, it will have no shunting capability as if the shunt plate 110 were not present. Furthermore, should the current in the wire coil 1506 be further increased, the magnetic field will act as a bias field, whereby the direction of the current through the wire coil 1506 will determine the polarity of the bias field relative to the magnetic structure 100.

FIG. 15B depicts a top view of the magnetic field control device 1500 of FIG. 15A.

Figure 15D:
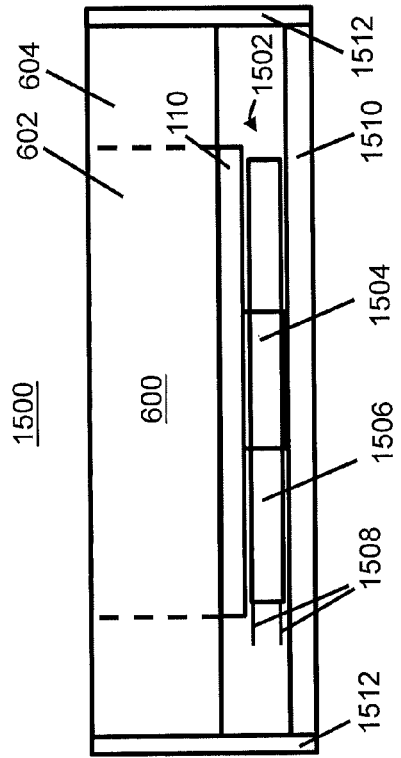
FIG. 15D depicts still another exemplary magnetic field control device.
Figure 15C:
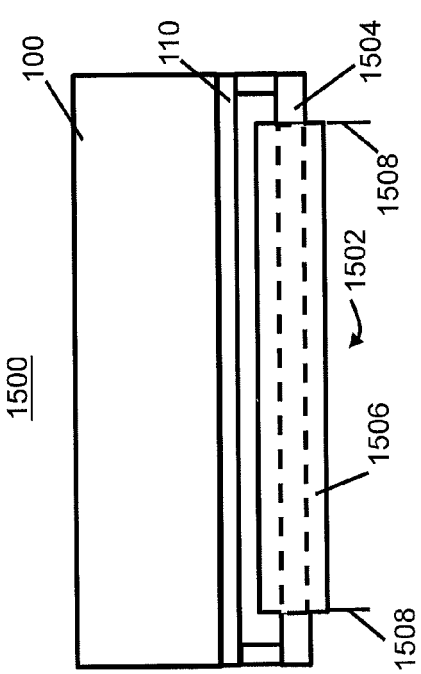
FIG. 15C depicts another exemplary magnetic field control device.

FIG. 15C depicts another exemplary magnetic field control device 1500 that is similar to magnetic field control device 1500 of FIG. 15A except the electromagnet device 1502 is different. Basically, a portion of the core 1504 of the electromagnet device 1502 is parallel to the shunt plate 110 enabling the windings of the wire coil 1506 to be much smaller. The remainder of the core 1504 provides a magnetic circuit to the shunt plate 110. Otherwise, the two magnetic field control devices 1500 of FIGS. 15A and 15C function substantially the same.

FIG. 15D depicts still another exemplary magnetic field control device 1500 that is similar to the magnetic field control device 1500 of FIG. 15A except the shunt plate 110 is associated with only a first portion 602 of a round magnetic structure 600 having two portions 602, 604. As such, the shunt plate 110 only provides its shunting effect to the maxels within the first portion 602 of the magnetic structure 600. In addition, the metal plate 1510 may also include additional metal portions 1512 that extend from the core 1504 of the electromagnet device 1502 to the outer sides of the second portion 604 of the magnetic structure 600. As such, when current is applied to the wire coil 1506, the shunting effect of the shunt plate 110 will be diminished while at the same time a bias field is applied to the second portion 604 of the magnetic structure 600, where the direction of the current determines the polarity of the bias field relative to the magnetic structure 600.

Figure 16C:
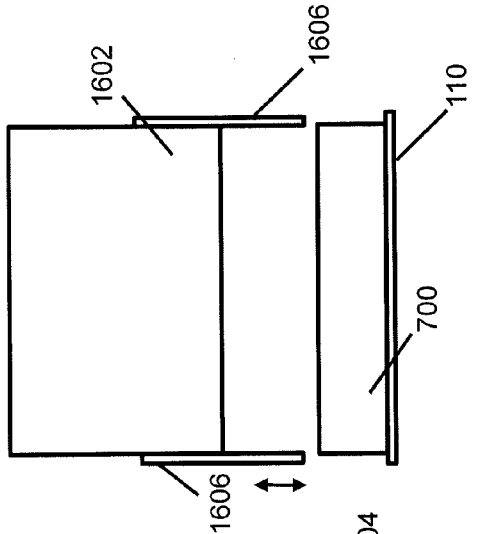
FIGS. 16A-16C depict an exemplary magnet being brought into close proximity of a shunt plate associated with a magnetic structure.

In a further embodiment of the invention, a shunt plate 110 associated with a magnetic structure 700 can be modulated by bringing a conventional magnet 1602 into close proximity to the shunt plate 110 in order to saturate it such as described in relation to FIG. 15A. FIG. 16A depicts an exemplary magnet 1602 being brought into close proximity of a shunt plate 110 associated with magnetic structure 700. Specifically, the magnet 1602 is being brought close to the shunt plate 110 on the back side of a magnetic structure.

Figure 16B:
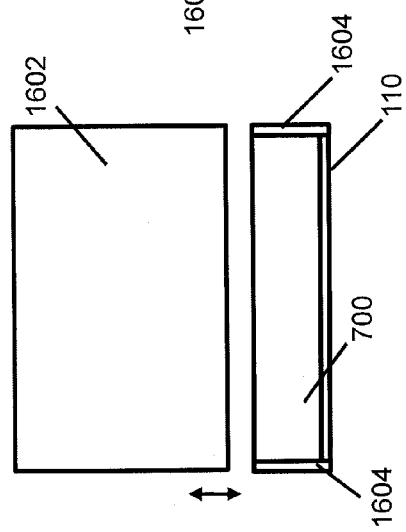
Figure 16A:
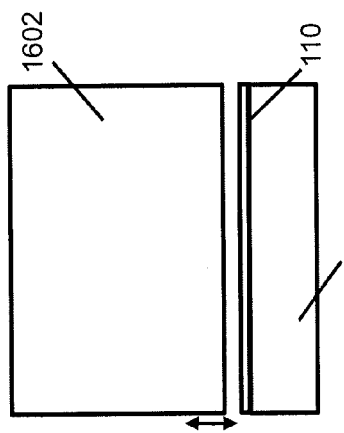

FIG. 16B depicts a magnet 1602 being brought close to the non-shunted side of a magnet where metal 1604 around the magnetic structure 700 acts as a magnetic circuit enabling the field of the magnet 1602 to saturate the shunt plate 110.

FIG. 16C a magnet 1602 being brought close to the non-shunted side of a magnet where metal 1606 around the magnet 1602 acts as a magnetic circuit enabling the field of the magnet 1602 to saturate the shunt plate 110.

Figure 17C:
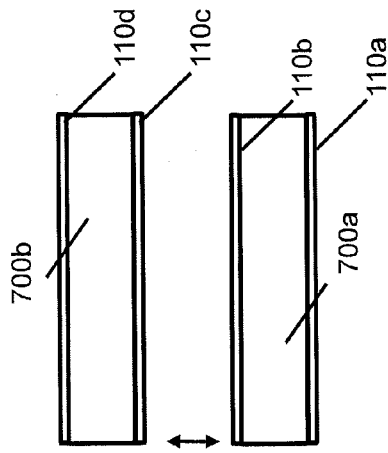
FIG. 17C depicts shunt plates associated with two magnetic structures each having shunt plates attached to both sides of the magnetic structure.
Figure 17B:
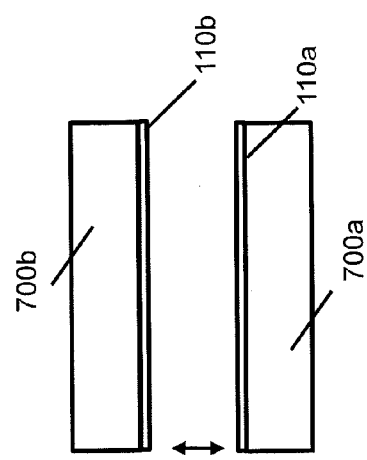
FIG. 17B depicts facing shunt plates associated with two magnetic structures oriented such that the shunt plates face each other.
Figure 17A:
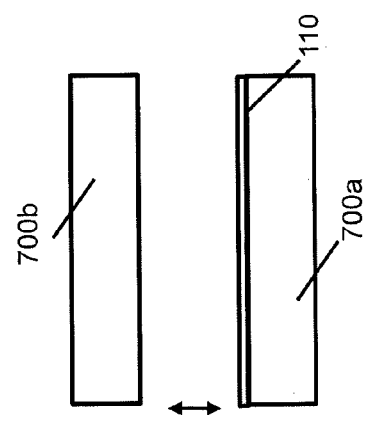
FIG. 17A depicts a shunt plate associated with a first magnetic structure that can be brought into contact with a second magnetic structure.

FIG. 17A depicts a shunt plate 110 associated with a first magnetic structure 700a that can be brought into contact with a second magnetic structure 700b. As such, the shunt plate 110 can be selected to provide shunting effects to both magnetic structures 700a 700b. If desired, the metal used for the shunt plate and its thickness can be selected to determine the amount of flux that can pass between the two magnetic structures 700a 700b.

FIG. 17B depicts facing shunt plates 110a 110b associated with two magnetic structures 700a 700b oriented such that the shunt plates 110a 110b face each other. As with the shunt plate of FIG. 17A, the metal used for the shunt plates and the thicknesses of the metal can be selected to determine the amount of flux that can pass between the two magnetic structures 700a 700b.

FIG. 17C depicts shunt plates 110a-110d associated with two magnetic structures 700 each having shunt plates attached to both sides of the magnetic structure. As with the shunt plate of FIG. 17A, the metal used for the shunt plates and the thicknesses of the shunt plates can be selected to determine the amount of flux that can pass between the two magnetic structures 700a 700b. For example, the two facing shunt plates 100b 110c may be selected to allow flux to pass when the two shunt plates are in contact, while the two outer shunt plates 110a 110d may be selected such that they substantially shunt/shield all flux.

Figure 18:
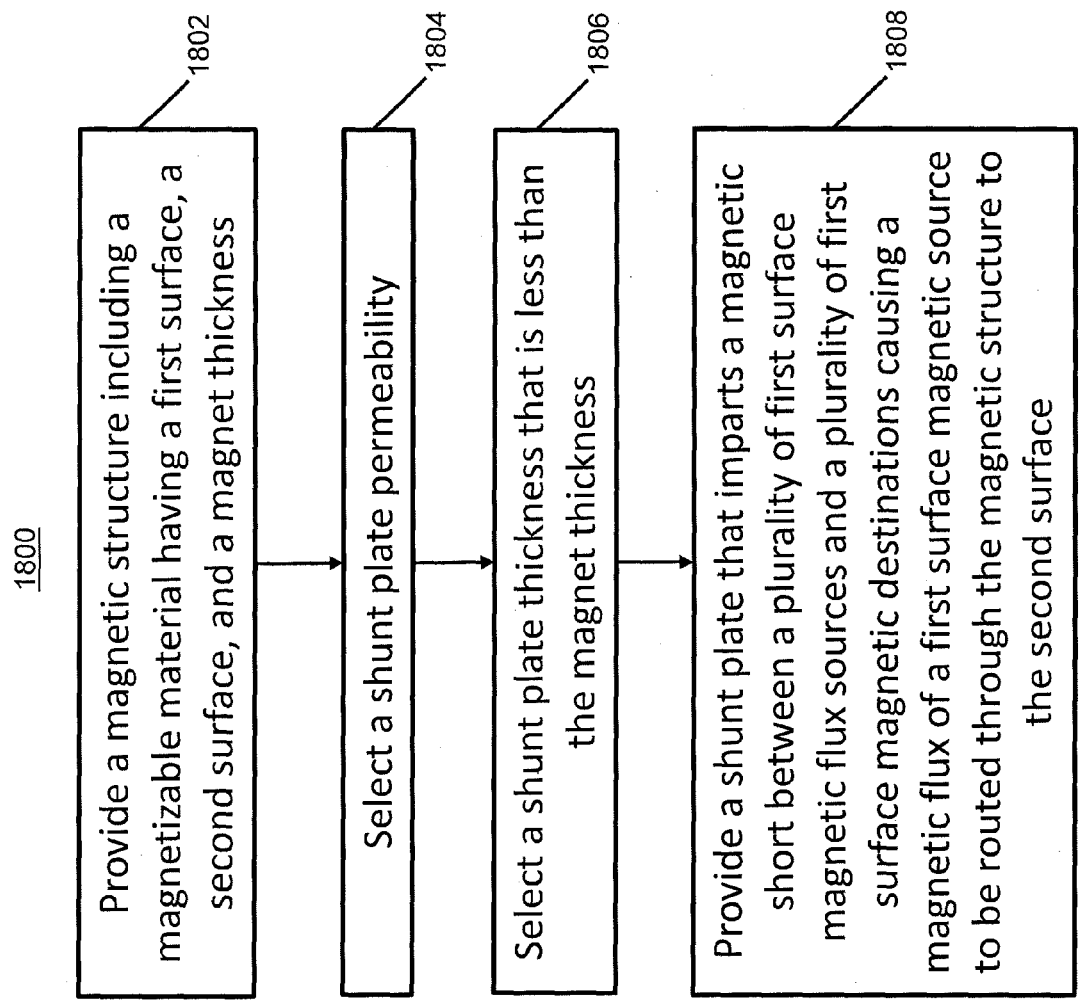
FIG. 18 depicts an exemplary method for routing flux.

FIG. 18 depicts an exemplary method 1800 for routing flux. Referring to FIG. 18, the method 1800 includes four steps. A first step 1802 is to provide a magnetic structure including a magnetizable material having a first surface, a second surface, and a magnet thickness. A second step 1804 is to select a shunt plate permeability. A third step 1806 is to select a shunt plate thickness that is less than the magnet thickness. A fourth step 1808 is to provide a shunt plate that imparts a magnetic short between a plurality of first surface magnetic flux sources and a plurality of first surface magnetic destinations. Under one arrangement, the shunt plate thickness can be selected by determining the integrated flux across a magnetic source of said magnetic structure such that the corresponding flux density in the shunt plate does not substantially exceed the flux density saturation level of a cross section of the shunt plate. Under another arrangement, the shunt plate thickness can be selected such that a flux density at a predetermined location is reduced. The shunt plate permeability can be selected by determining the integrated flux across a magnetic source of said magnetic structure such that the corresponding flux density in the shunt plate does not substantially exceed the flux density saturation level of a cross section of the shunt plate. Moreover, the shunt plate permeability can be selected such that a flux density at a predetermined location is reduced. If desirable, the shunt plate permeability and the shunt plate thickness can be selected such that a flux density at a predetermined is reduced. Under still another arrangement, the shunt plate permeability and said shunt plate thickness can be selected by determining the integrated flux across a magnetic source of said magnetic structure such that the corresponding flux density in the shunt plate does not substantially exceed the flux density saturation level of a cross section of the shunt plate.

The following calculations provide an example of selecting a thickness of a shunt plate (SP) for a magnetic structure of printed maxels (M) each having a 1 mm radius as compared to magnetically equivalent back iron required for three different axially magnetized 1.5875 mm thick disk neodymium iron boron (NIB) magnets A, B, and C having radii of 12.7 mm, 25.4 mm, and 38.1 mm. For this example, the metal used for the shunt plate and back iron is iron having a flux density saturation level (FDSL) of 20000 Gauss and a weight of 0.00787 g/mm$^3$. The maxels of the magnetic structure and the conventional magnets all have a flux density (FD) of 3500 Gauss. Each back iron has a gap around the magnets equal to 10% of the back iron diameter between the magnet and the side portions of the back iron wrapping up to the upper surface of the magnet.

$$Area_M = \pi \times 1 \text{ mm}^2 = 3.14 \text{ mm}^2$$

$$Area_A = \pi \times 12.7 \text{ mm}^2 = 506.71 \text{ mm}^2$$

$$Area_B = \pi \times 25.4 \text{ mm}^2 = 2026.83 \text{ mm}^2$$

$$Area_C = \pi \times 38.1 \text{ mm}^2 = 4560.37 \text{ mm}^2$$

$$\text{Total Flux}_M = Area_M \times \text{Flux Density} = 3.14 \text{ mm}^2 \times 3500 \text{ G} = 10995.57 \text{ Gmm}^2$$

$$\text{Total Flux}_A = Area_A \times \text{Flux Density} = 506.71 \text{ mm}^2 \times 3500 \text{ G} = 19305.55 \text{ Gmm}^2$$

$$\text{Total Flux}_B = Area_B \times \text{Flux Density} = 2026.83 \text{ mm}^2 \times 3500 \text{ G} = 77222.22 \text{ Gmm}^2$$

$$\text{Total Flux}_C = Area_C \times \text{Flux Density} = 4560.37 \text{ mm}^2 \times 3500 \text{ G} = 173749.99 \text{ Gmm}^2$$

$$FD/FDSL = 3500 \text{ G}/20000 \text{ G} = 0.175$$

$$\text{Cross Sectional Area}_{SP} = Area_M \times FD/FDSL = 0.55 \text{ mm}^2$$

$$\text{Cross Sectional Area}_A = Area_A \times FD/FDSL = 88.67 \text{ mm}^2$$

$$\text{Cross Sectional Area}_B = Area_B \times FD/FDSL = 354.7 \text{ mm}^2$$

$$\text{Cross Sectional Area}_C = Area_C \times FD/FDSL = 798.06 \text{ mm}^2$$

$$\text{Thickness}_{SP} = \text{Cross Sectional Area}_{SP}/(2\pi \times 1 \text{ mm}) = 0.0875 \text{ mm}$$

$$\text{Thickness}_A = \text{Cross Sectional Area}_A/(2\pi \times 12.7 \text{ mm}) = 1.1113 \text{ mm}$$

$$\text{Thickness}_B = \text{Cross Sectional Area}_B/(2\pi \times 25.4 \text{ mm}) = 2.2225 \text{ mm}$$

$$\text{Thickness}_C = \text{Cross Sectional Area}_C/(2\pi \times 38.1 \text{ mm}) = 3.3338 \text{ mm}$$

Because the thickness of a shunt plate that is required to cause a given amount of flux routing and shielding primarily depends on the area (e.g., diameter) of a maxel, the thickness is to a large extent independent of the size of the surface area of the magnetizable material on which the maxel is magnetized. In contrast, the thickness of back iron that is required to achieve the same amount of flux routing and shielding is dependent on the entire surface area (e.g., diameter) of a conventional magnet and increases as the surface area increases. As such, the difference in thickness of a shunt plate versus that of back iron can become quite substantial depending on the size of a maxel in a multi-pole magnetic structure versus the size of a conventional dipole magnet.

The previous calculations assume the diameter of each magnetized maxel remains constant through the magnetized material (i.e., the maxel volume is the shape of a cylinder). One skilled in the art will recognize that maxels printed from only one side of a magnetizable material may not have a constant diameter through the material in which case various calculations could be employed to accommodate a different maxel shape and thus a different volume. For example, a maxel might be modeled as a (upside down) Gaussian surface or a portion of a Gaussian surface where the widest portion is at the surface where the maxel is magnetized and the diameter of the maxel thereafter reduces as the maxel extends into the magnetizable material in accordance with a Gaussian surface model, where the Gaussian surface may be clipped or be completed depending on the thickness of the magnetizable material, the strength of the H-field used to magnetize the maxel, and various other factors. However, regardless of how the maxel volume is modeled, the flux routing efficiency differences between multi pole magnetic structures having shunt plates versus conventionally magnetized magnets having back iron are essentially the same.

For further comparison, the total volume of iron, total weight, and iron to magnet ratios for shunt plates for the three sizes of magnetizable material having printed maxels versus for back iron for the three sizes of magnetizable material conventionally magnetized as dipoles is calculated below.

$$\text{Back Iron Inner Radius}_A = \text{Radius}_A \times (1+10/100) = 12.8 \text{ mm}$$

$$\text{Back Iron Inner Radius}_B = \text{Radius}_B \times (1+10/100) = 25.5 \text{ mm}$$

$$\text{Back Iron Inner Radius}_C = \text{Radius}_C \times (1+10/100) = 38.2 \text{ mm}$$

$$\text{Back Iron Outer Radius}_A = \text{Back Iron Inner Radius}_A + \text{Thickness}_A = 13.91 \text{ mm}$$

$$\text{Back Iron Outer Radius}_B = \text{Back Iron Inner Radius}_B + \text{Thickness}_B = 27.72 \text{ mm}$$

$$\text{Back Iron Outer Radius}_C = \text{Back Iron Inner Radius}_C + \text{Thickness}_C = 41.53 \text{ mm}$$

$$\text{Back Iron Inner Volume}_A = \pi \times \text{Back Iron Inner Radius}_A^2 \times 1.5875 \text{ mm} = 817.12 \text{ mm}^3$$

$$\text{Back Iron Inner Volume}_B = \pi \times \text{Back Iron Inner Radius}_B^2 \times 1.5875 \text{ mm} = 3242.98 \text{ mm}^3$$

$$\text{Back Iron Inner Volume}_C = \pi \times \text{Back Iron Inner Radius}_C^2 \times 1.5875 \text{ mm} = 7277.64 \text{ mm}^3$$

$$\text{Back Iron Outer Volume}_A = \pi \times \text{Back Iron Outer Radius}_A^2 \times 1.5875 \text{ mm} = 965.15 \text{ mm}^3$$

$$\text{Back Iron Outer Volume}_B = \pi \times \text{Back Iron Outer Radius}_B^2 \times 1.5875 \text{ mm} = 3832.91 \text{ mm}^3$$

$$\text{Back Iron Outer Volume}_C = \pi \times \text{Back Iron Outer Radius}_C^2 \times 1.5875 \text{ mm} = 8603.32 \text{ mm}^3$$

$$\text{Back Iron Sides Volume}_A = 965.15 \text{ mm}^3 - 817.12 \text{ mm}^3 = 148.04 \text{ mm}^3$$

$$\text{Back Iron Sides Volume}_B = 3832.91 \text{ mm}^3 - 3242.98 \text{ mm}^3 = 589.93 \text{ mm}^3$$

$$\text{Back Iron Sides Volume}_C = 8603.32 \text{ mm}^3 - 7277.64 \text{ mm}^3 = 1325.68 \text{ mm}^3$$

$$\text{Back Iron Bottom Volume}_A = \pi \times (13.91 \text{ mm})^2 \times 1.1113 \text{ mm} = 675.61 \text{ mm}^3$$

$$\text{Back Iron Bottom Volume}_B = \pi \times (27.72 \text{ mm})^2 \times 2.2225 \text{ mm} = 5366.07 \text{ mm}^3$$

$$\text{Back Iron Bottom Volume}_C = \pi \times (41.53 \text{ mm})^2 \times 3.3338 \text{ mm} = 18066.96 \text{ mm}^3$$

$$\text{Total Back Iron Volume}_A = 148.04 \text{ mm}^3 + 675.61 \text{ mm}^3 = 823.64 \text{ mm}^3$$

$$\text{Total Back Iron Volume}_B = 589.93 \text{ mm}^3 + 5366.07 \text{ mm}^3 = 5956.00 \text{ mm}^3$$

Total Back Iron Volume$_C$=1325.68 mm$^3$+18066.96 mm$^3$=19392.64 mm$^3$

Total Shunt Plate Volume$_A$=π×(12.7 mm)$^2$×0.0875 mm=44.34 mm$^3$

Total Shunt Plate Volume$_B$=π×(25.4 mm)$^2$×0.0875 mm=177.35 mm$^3$

Total Shunt Plate Volume$_C$=π×(38.1 mm)$^2$×0.0875 mm=399.03 mm$^3$

Total Back Iron Volume$_A$/Total Shunt Plate Volume$_A$=18.58

Total Back Iron Volume$_B$/Total Shunt Plate Volume$_B$=33.58

Total Back Iron Volume$_C$/Total Shunt Plate Volume$_C$=48.6

Total Weight Back Iron$_A$=823.64 mm$^3$×0.00787 g/mm$^3$=6.48 g

Total Weight Back Iron$_B$=5956.0 mm$^3$×0.00787 g/mm$^3$=46.87 g

Total Weight Back Iron$_C$=19392.64 mm$^3$×0.00787 g/mm$^3$=152.62 g

Total Weight Shunt Plate$_A$=44.34 mm$^3$×0.00787 g/mm$^3$=0.35 g

Total Weight Shunt Plate$_B$=177.35 mm$^3$×0.00787 g/mm$^3$=1.4 g

Total Weight Shunt Plate$_C$=399.03 mm$^3$×0.00787 g/mm$^3$=3.14 g

Total Weight Back Iron$_A$−Total Weight Shunt Plate$_A$=6.13 g

Total Weight Back Iron$_A$−Total Weight Shunt Plate$_A$=45.48 g

Total Weight Back Iron$_A$−Total Weight Shunt Plate$_A$=149.48 g

Magnet Volume$_A$=804.4 mm$^3$

Magnet Volume$_B$=3217.6 mm$^3$

Magnet Volume$_C$=7239.6 mm$^3$

Magnet Weight$_A$=6.03 g

Magnet Weight$_B$=24.13 g

Magnet Weight$_C$=54.3 g

Total Weight of Back Iron$_A$+Conventional Magnet$_A$=12.52 g

Total Weight of Back Iron$_B$+Conventional Magnet$_B$=71.01 g

Total Weight of Back Iron$_C$+Conventional Magnet$_C$=206.92 g

Total Weight of Shunt Plate$_A$+Multi-pole Magnetic Structure$_A$=6.38 g

Total Weight of Shunt Plate$_B$+Multi-pole Magnetic Structure$_B$=15.23 g

Total Weight of Shunt Plate$_C$+Multi-pole Magnetic Structure$_C$=57.44 g

Ratio of Iron to Conventional Magnet$_A$=1.074

Ratio of Iron to Conventional Magnet$_B$=1.942

Ratio of Iron to Conventional Magnet$_C$=2.81

Ratio of Iron to Multi-pole Magnetic Structure$_A$=0.058

Ratio of Iron to Multi-pole Magnetic Structure$_B$=0.058

Ratio of Iron to Multi-pole Magnetic Structure$_C$=0.058

Multi-pole magnetic structures having shunt plates have clear weight and volume advantages over conventional magnets having back iron because the required thicknesses of shunt plates are a function of maxel area whereas the required thicknesses of back iron are function of the surface area of the magnetizable material, where the advantages grow substantially as the size of the magnetizable material surface increases. Where for conventionally magnetized magnets the ratio of iron to magnetizable material grows with the size of the magnets, the ratio of iron to magnetizable material remains constant for multi-pole magnetic structures having magnetically printed maxels.

The invention is generally applicable to magnet-on-magnet and magnet-on-metal applications and is applicable to generators, motors, actuators, and the like.

While particular embodiments of the invention have been described, it will be understood, however, that the invention is not limited thereto, since modifications may be made by those skilled in the art, particularly in light of the foregoing teachings.

The invention claimed is:

1. A magnetic flux shielding system, comprising:
a magnetic structure having a first thickness, said magnetic structure comprising a plurality of magnetic sources, said plurality of magnetic sources including opposite polarity magnetic sources having an opposite polarity orientation, said magnetic structure having a first side and a second side, said second side being opposite said first side, said plurality of magnetic sources extending from said first side of said magnetic structure to said second side of said magnetic structure;
a first shunt plate associated with said first side of said magnetic structure, said first shunt plate having a second thickness less than said first thickness; and
a second shunt plate associated with said second side of said magnetic structure, said second shunt plate having a third thickness less than said first thickness, said second shunt plate being a removable shunt plate, said first shunt plate and said second shunt plate substantially shielding the flux of the magnetic structure;
wherein when said first shunt plate is in contact with said magnetic structure, said first shunt plate provides a magnetic short between opposite polarity magnetic sources on said first side of said magnetic structure, said magnetic short causing a magnetic flux of said opposite polarity magnetic sources to be routed from said first side of said magnetic structure through said magnetic structure to said second side of said magnetic structure.

2. The system of claim 1, wherein said magnetic structure comprises magnetic sources printed into a magnetizable material.

3. The system of claim 1, wherein said second thickness is less than half of said first thickness.

4. The system of claim 1, wherein said second thickness is less than one quarter of said first thickness.

5. The system of claim 1, wherein said second thickness is less than a tenth of an inch thick.

6. The system of claim 1, wherein said second thickness is less than a hundredth of an inch thick.

7. The system of claim 1, wherein said first shunt plate allows only ten percent or less leakage of magnetic flux through said first shunt plate.

8. The system of claim 1, wherein said first shunt plate is a removable shunt plate.

9. The system of claim 1, further comprising:
a spacer between said first shunt plate and said magnetic structure.

10. The system of claim 1, wherein said first shunt plate is permanently attached to said first side of said magnetic structure.

11. The system of claim 1, wherein said first shunt plate is attached magnetically, attached using an adhesive, or attached via compression as result of a fixture interfacing with said magnetic structure.

12. The system of claim 1, wherein said first shunt plate comprises a layer of metal applied to said first surface of said magnetic structure using one of a thin-film deposition technique, a vapor deposition technique, or a sputter deposition technique.

13. The system of claim 1, wherein said first shunt plate comprises a layer of metal applied to said first surface of said magnetic structure using one of an electroplating technique, a vacuum arc technique, or a plasma deposition technique.

14. The system of claim 1, wherein said first shunt plate comprises one of powdered metal sintered onto a surface of said magnetizable material or powdered metal within at least one of a paint material or an adhesive material.

15. The system of claim 1, wherein said second shunt plate is flexible.

16. The system of claim 1, further comprising: a spacer between said second shunt plate and said magnetic structure.

17. The system of claim 16, wherein said spacer is flexible.

18. The system of claim 1, further comprising:
a storage container, wherein at least one of said first shunt plate and said second shunt plate are between said storage container and said magnetic structure.

19. The system of claim 18, wherein said storage container is a pouch.

* * * * *